US012707860B2

(12) United States Patent
Kang et al.

(10) Patent No.: US 12,707,860 B2
(45) Date of Patent: Aug. 11, 2026

(54) DISPLAY DEVICE

(71) Applicant: Samsung Display Co., Ltd., Yongin-Si (KR)

(72) Inventors: Donggyu Kang, Asansi (KR); Sedong Kim, Cheonan-si (KR); Yeontaek Jeong, Seoul (KR); Wal Jun Kim, Hwaseong-si (KR)

(73) Assignee: Samsung Display Co., Ltd., Yongin-Si (KR)

(*) Notice: Subject to any disclaimer, the term of this patent is extended or adjusted under 35 U.S.C. 154(b) by 746 days.

(21) Appl. No.: 17/950,835

(22) Filed: Sep. 22, 2022

(65) Prior Publication Data

US 2023/0157053 A1 May 18, 2023

(30) Foreign Application Priority Data

Nov. 15, 2021 (KR) ........................ 10-2021-0156497

(51) Int. Cl.
*H10K 59/80* (2023.01)
*H10K 59/12* (2023.01)
*H10K 59/38* (2023.01)

(52) U.S. Cl.
CPC ........... *H10K 59/873* (2023.02); *H10K 59/38* (2023.02); *H10K 59/12* (2023.02)

(58) Field of Classification Search
CPC ......... H10K 59/10–18; H10K 50/8426; H10K 50/8428; H10K 59/87–8731; H10K 71/50; H10K 50/84–846; H10H 29/30
See application file for complete search history.

(56) References Cited

U.S. PATENT DOCUMENTS 8,876,272 B2 11/2014 Linton et al.
9,063,379 B2 6/2015 Kim et al.
9,337,248 B2 5/2016 Youk et al.
10,454,061 B2 10/2019 Jo et al.
(Continued)

FOREIGN PATENT DOCUMENTS

KR 20100108756 A 10/2010
KR 1020140062669 A 5/2014
(Continued)

*Primary Examiner* — Sue A Purvis
*Assistant Examiner* — Jason James Greaving
(74) *Attorney, Agent, or Firm* — Innovation Counsel LLP

(57) ABSTRACT

A display device may include a first substrate including an upper surface; a second substrate including a rear surface facing the upper surface; a sealing member disposed between the first substrate and the second substrate; light emitting elements disposed on the upper surface; a circuit layer disposed between the first substrate and the light emitting elements, and including driving elements respectively connected to the light emitting elements; an alignment pattern disposed on the upper surface and spaced apart from the light emitting elements; a color filter layer including color filters disposed on the rear surface, and having a penetration portion aligned with the alignment pattern; a filling member disposed between the color filter layer and the light emitting elements; and a filling member blocking portion disposed between the filling member and the penetration portion in a plan view, wherein the filling member may be spaced apart from the penetration portion.

22 Claims, 25 Drawing Sheets

(56) References Cited

U.S. PATENT DOCUMENTS

| | | | | |
|---|---|---|---|---|
| 11,223,024 | B2 | 1/2022 | Kim | |
| 11,342,525 | B2 | 5/2022 | Kim et al. | |
| 11,600,804 | B2 | 3/2023 | Kim et al. | |
| 11,690,244 | B2 | 6/2023 | Lee et al. | |
| 11,800,772 | B2 | 10/2023 | Oh et al. | |
| 2010/0245271 | A1* | 9/2010 | Park | H10K 59/8722 345/173 |
| 2015/0318447 | A1* | 11/2015 | Choi | H10K 19/10 257/98 |
| 2016/0035997 | A1* | 2/2016 | Oh | H10K 50/8426 257/40 |
| 2021/0036062 | A1* | 2/2021 | Kim | H10K 59/122 |
| 2022/0157893 | A1* | 5/2022 | Baek | H10K 59/873 |
| 2023/0116218 | A1* | 4/2023 | Kang | H10K 71/00 257/72 |

FOREIGN PATENT DOCUMENTS

| | | | |
|---|---|---|---|
| KR | 20160038559 | A | 4/2016 |
| KR | 10-2016-0069069 | A | 6/2016 |
| KR | 101730164 | B1 | 4/2017 |
| KR | 20180024819 | A | 3/2018 |
| KR | 10-2020-0058665 | A | 5/2020 |
| KR | 1020170038605 | A | 6/2020 |
| KR | 10-2020-0130645 | A | 11/2020 |
| KR | 10-2020-0136550 | A | 12/2020 |
| KR | 20200136526 | A | 12/2020 |
| KR | 1020210016129 | A | 2/2021 |
| KR | 20210101380 | A | 8/2021 |

* cited by examiner

FIG. 3

DP
DA
NDA
SUB1
PXnm
DLm
GL1
GLn
PX11
DL1
MK
SAL-a
GDC
DR1
DR2
DR3

DP
DA
NDA
SUB1
MK
SAL-a
PXA1
PXA2
PXA3
NPXA
I
I'
DR1
DR2
DR3

CFL
CF1
CF2
CF3
DM
SUB2
LR
CP1
BK
CP2
FL
EN3
EN2
EN1
TFE
CE
EML
OL
AE
PDL
LCM
LCL
CS
DP-OL
DP
DP-CL
SUB1
WCP1
WCP2
WCP3
I
I'
NPXA
PXA1
NPXA
PXA2
NPXA
PXA3
NPXA
DA
DR3
DR2
DR1

DM
DA
NDA
CFL
SUB2
AA
MK
RP
FDM
SAL
FL
DR1
DR2
DR3

DM
LCM
LCL
DP
TFE
OL
SUB2
LR
CP1
CP2
FL
EN3
EN2
EN1
CE
EML
AE
INS12
INS11
INS10
SUB1
DR1
DR2
DR3
BK
WCP1
CF1
BK
PU
CFL
CF1 CF2 CF3
NPXA
PXA1
DA
PDL
DAM1
DAM2
DAM3
COP
NDA
SAL
II'
II

DM
SUB2
LR
CP1
LCL
CP2
LCM
FL
EN3
EN2
EN1
TFE
INS11
SUB1
DP
IV'
BK
DAM1
DAM2
DAM3
FDM
FDM-a1
FDM-a2
NDA
MK
RP
CFL
CF1
CF2
CF3
SAL
IV

RP'
BU

RP'
BU

DM
LCM
SUB2
LR
CP1
LCL
CP2
FL
TFE
EN3
EN2
EN1
DP
INS11
SUB1
V'
BK
DAM1
DAM2
DAM3
FDM-a
NDA
MK
RP
FDM-a
CFL
CF1
CF2
CF3
SAL
V

DM
LCM
SUB2
LR
CP1
LCL
CP2
FL
EN3
EN2
EN1
TFE
DP
INS11
SUB1
V'
BK
DAM1
DAM2
DAM3
FDM-b
NDA
MK
RP
FDM-b
CFL
CF1
CF2
CF3
SAL
V

DISPLAY DEVICE

CROSS-REFERENCE TO RELATED APPLICATIONS

This U.S. non-provisional patent application claims priority under 35 U.S.C. § 119 of Korean Patent Application No. 10-2021-0156497 filed on Nov. 15, 2021, the entire content of which is hereby incorporated by reference.

BACKGROUND

The present disclosure herein relates to a display device, and more particularly, to a display device with improved reliability.

Multimedia electronic devices such as televisions, mobile phones, tablet computers, navigation system units, and game consoles may each be equipped with a display device for displaying images. The display device may include a plurality of pixels to display images, and each of the pixels may include a light emitting element which generates light, and a driving element connected to the light emitting element.

Recently, r to improve the visibility and color purity of a display device, the display device including a light conversion layer has been developed. Accordingly, the display device may be manufactured by bonding a substrate including a light emitting element and a substrate including a light conversion layer. However, defects may be caused in the process of bonding the substrates of the display device, and thus, there is a need for research to address the issue.

SUMMARY

The present disclosure provides a display device with improved reliability by preventing errors occurring in a manufacturing process of a display device.

An embodiment of the inventive concept provides a display device including a first substrate including an upper surface and a lower surface; a second substrate including a rear surface facing the upper surface; a sealing member disposed between the first substrate and the second substrate to couple the first substrate and the second substrate; a plurality of light emitting elements disposed on the upper surface; a circuit layer disposed between the first substrate and the light emitting elements, and including a plurality of driving elements respectively connected to the plurality of light emitting elements; an alignment pattern disposed on the upper surface and spaced apart from the plurality of light emitting elements, a color filter layer including a plurality of color filters disposed on the rear surface, and having a penetration portion overlapping the alignment pattern in a plan view; a filling member disposed between the color filter layer and the light emitting elements, and a filling member blocking portion disposed between the filling member and the penetration portion in the plan view, wherein the filling member is spaced apart from the penetration portion.

In an embodiment, the filling member blocking portion may surround at least a portion of the outer perimeter of the penetration portion.

In an embodiment, the filling member blocking portion may surround the penetration portion in plan view.

In an embodiment, a portion of the filling member blocking portion may be covered by the filling member.

In an embodiment, the filling member blocking portion may include a hole penetrating the color filter layer, and a portion of the color filter layer is between the hole of the filling member blocking portion and the penetration portion.

In an embodiment, the width of the hole of the filling member blocking portion may be uniform.

In an embodiment, the width of the hole of the filling member blocking portion changes as a function of distance from the rear surface of the second substrate.

In an embodiment, the filling member blocking portion may include a blocking dam, and the blocking dam may be disposed on a lower surface of the color filter layer and may protrude toward the first substrate.

In an embodiment, the display device may further include a light conversion layer disposed between the color filter layer and the filling member, wherein the light conversion layer may include a bank portion including a plurality of openings respectively overlapping the plurality of light emitting elements; and a plurality of light conversion portions respectively disposed in the plurality of openings.

In an embodiment, the blocking dam may include the same material as the material of the bank portion.

In an embodiment, the display device may further include a column spacer disposed between the color filter layer and the plurality of light emitting elements, and covered by the filling member, wherein the blocking dam may include the same material as the material of the column spacer.

In an embodiment, the blocking dam may be provided in plurality, and the plurality of the blocking dams may have the same size.

In an embodiment, the blocking dam may be provided in plurality, and the plurality of the blocking dams may have different sizes.

In an embodiment, the color filter layer may include a first portion in which the plurality of color filters are stacked in a thickness direction that is orthogonal to the rear surface, and the penetration portion may be defined by absence of the plurality of color filters.

In an embodiment, the width of the penetration portion may be uniform.

In an embodiment, the width of the penetration portion adjacent to the rear surface of the second substrate may be smaller than the width of the penetration portion adjacent to a lower surface of the color filter layer.

In an embodiment, the shape of the penetration portion may be the same as the shape of the alignment pattern.

In an embodiment, the display device may further include an insulation layer disposed between the color filter layer and the filling member, wherein the insulation layer may cover the penetration portion.

In an embodiment, the penetration portion may be disposed between the sealing member and the filling member.

In an embodiment, the display device may further include an encapsulation layer disposed between the filling member and the plurality of light emitting elements; and a dam disposed outside of the encapsulation layer and contacting the encapsulation layer, wherein the filling member blocking portion may be spaced apart from the encapsulation layer.

In an embodiment, the alignment pattern may include a metal.

In an embodiment of the inventive concept, a display device includes a lower substrate including an upper surface; an upper substrate including a rear surface facing the upper surface; a sealing member disposed between the lower substrate and the upper substrate to couple the lower substrate and the upper substrate; a plurality of light emitting elements disposed on the upper surface; a circuit layer disposed between the lower substrate and the plurality of light emitting elements, and including a plurality of driving elements connected to the plurality of light emitting elements; an alignment pattern disposed on the upper surface and spaced apart from the plurality of light emitting elements; an encapsulation layer configured to encapsulate the plurality of light emitting elements; a color filter layer disposed on the rear surface and having a penetration portion that is aligned with the alignment pattern; a filling member disposed between the color filter layer and the encapsulation layer; and a filling member blocking portion disposed between the penetration portion and the filling member in plan view, and protruding or recessed from a lower surface of the color filter layer.

In an embodiment, the filling member blocking portion may surround at least a portion of the outer perimeter of the penetration portion.

BRIEF DESCRIPTION OF THE FIGURES

The accompanying drawings are included to provide a further understanding of the inventive concept, and are incorporated in and constitute a part of this specification. The drawings illustrate exemplary embodiments of the inventive concept and, together with the description, serve to explain principles of the inventive concept. In the drawings:

FIG. 3 is a plan view of a display panel according to an embodiment of the inventive concept:

DETAILED DESCRIPTION

Figure 1A:
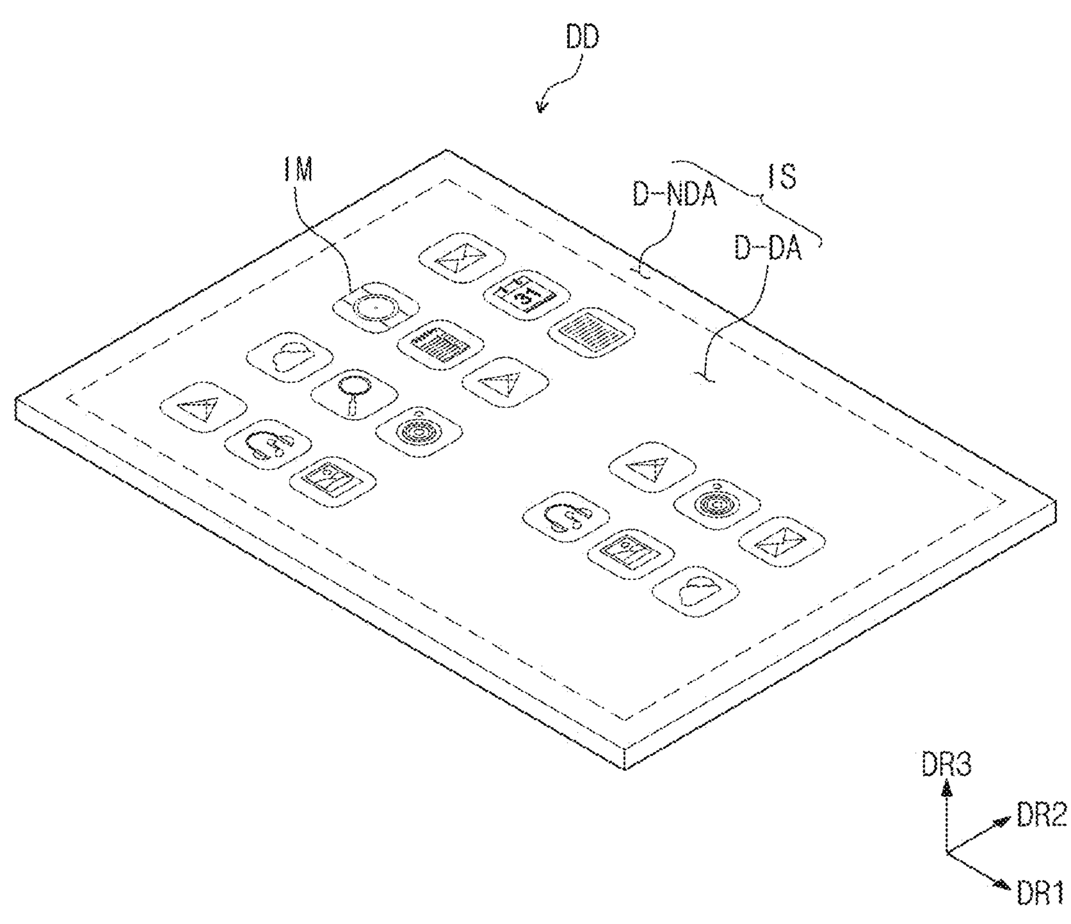
FIG. 1A is a perspective view of a display device according to an embodiment of the inventive concept.

The inventive concept may be modified in many alternate forms, and thus specific embodiments will be exemplified in the drawings and described in detail. It should be understood, however, that it is not intended to limit the inventive concept to the particular forms disclosed, but rather, is intended to cover all modifications, equivalents, and alternatives falling within the spirit and scope of the invention.

In the present disclosure, when an element (or a region, a layer, a portion, etc.) is referred to as being "on," "connected to," or "coupled to" another element, it means that the element may be directly disposed on/connected to/coupled to the other element, or that a third element may be disposed therebetween.

Like reference numerals refer to like elements. Also, in the drawings, the thickness, the ratio, and the dimensions of elements are exaggerated for an effective description of technical contents. The term "and/or" includes any and all combinations of one or more of which associated elements may define.

It will be understood that, although the terms "first," "second," etc. may be used herein to describe various elements, these elements should not be limited by these terms. These terms are only used to distinguish one element from another. For example, a first element may be referred to as a second element, and a second element may also be referred to as a first element in a similar manner without departing the scope of rights of the present invention. The terms of a singular form may include plural forms unless the context clearly indicates otherwise.

In addition, terms such as "below," "lower," "above," "upper," and the like are used to describe the relationship of the elements shown in the drawings. The terms are used as a relative concept and are described with reference to the direction indicated in the drawings.

It should be understood that the terms "comprise," or "have" are intended to specify the presence of stated features, integers, steps, operations, elements, components, or combinations thereof in the disclosure, but do not preclude the presence or addition of one or more other features, integers, steps, operations, elements, components, or combinations thereof.

Unless otherwise defined, all terms (including technical and scientific terms) used herein have the same meaning as commonly understood by one of ordinary skill in the art to which the present invention pertains. It is also to be understood that terms such as terms defined in commonly used dictionaries should be interpreted as having meanings consistent with the meanings in the context of the related art, and should not be interpreted in too ideal a sense or an overly formal sense unless explicitly defined herein.

Hereinafter, a display device according to an embodiment of the inventive concept will be described with reference to the accompanying drawings.

Figure 1B:
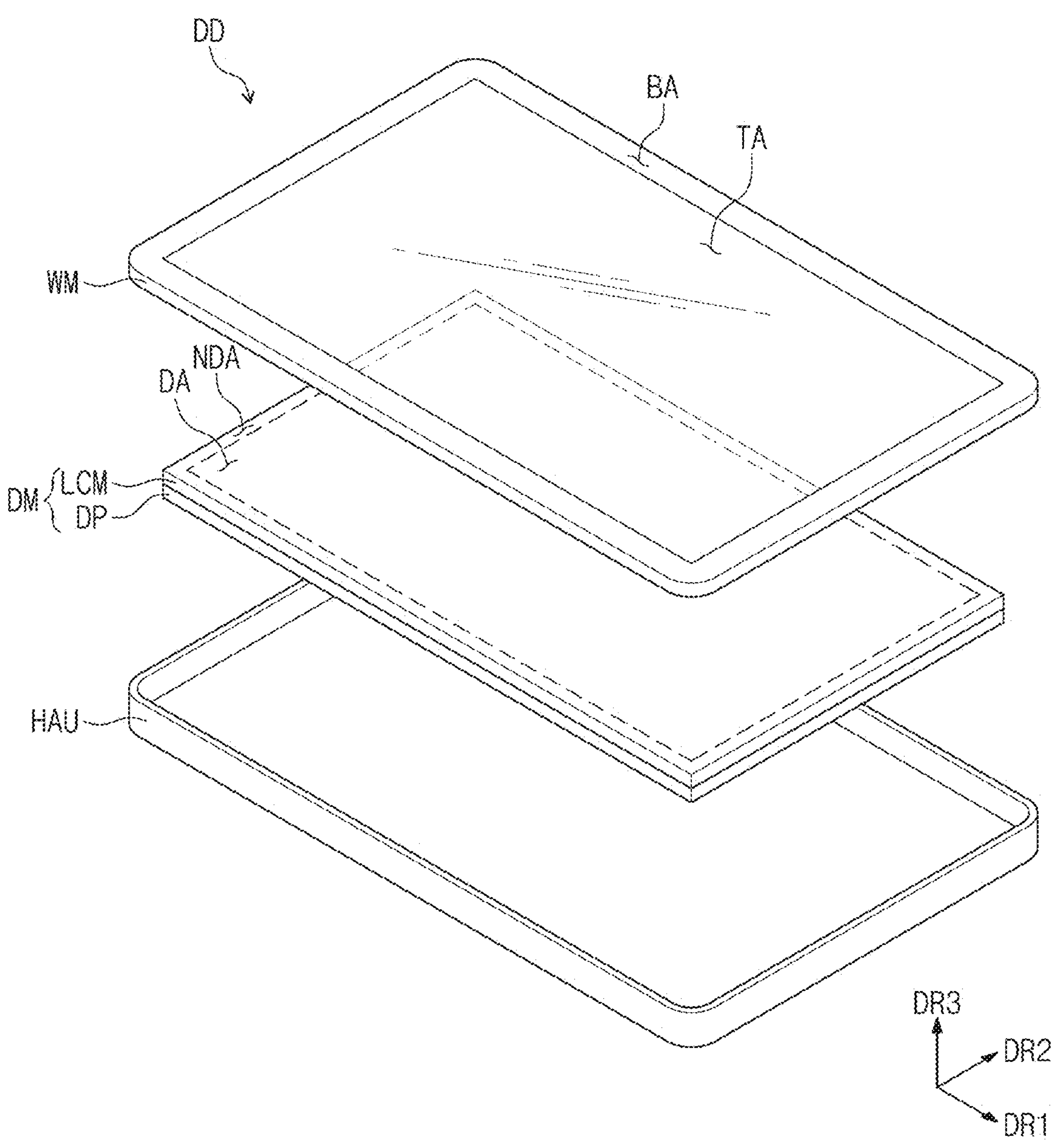
FIG. 1B is an exploded perspective view of a display device according to an embodiment of the inventive concept.

FIG. 1A is a perspective view of a display device DD of an embodiment. FIG. 1B is an exploded perspective view of the display device DD illustrated in FIG. 1A.

A display device DD may be a device which is activated according to an electrical signal, and which displays images. The display device DD may be included in embodiments of various electronic devices. For example, the display device DD may be included in a large-sized device such as a television and an external billboard, and also in a small-and-medium-sized device such as a monitor, a mobile phone, a tablet computer, a navigation system unit, and a game console. However, the embodiments of the display device DD are exemplary, and the display device DD is not limited to any one thereof without departing from the inventive concept.

Referring to FIG. 1A, the display device DD may have a rectangular shape which has long sides extending in a first direction DR1, and short sides extending in a second direction DR2 in plan view. However, the inventive concept is not limited thereto, and the display device DD may have various shapes such as a circular shape and a polygonal shape.

The display device DD may display an image IM in a third direction DR3 on a display surface IS that is parallel to a plane defined by the first direction DR1 and the second direction DR2. The third direction DR3 may be parallel to the direction that is normal to the display surface IS (herein referred to as the "normal direction." The display surface IS on which the image IM is displayed may correspond to the front surface of display device DD. The image IM may include both a moving image and a still image. In FIG. 1A, as an example of the image IM, icon images are illustrated.

In the present embodiment, a front surface (or upper surface) and a rear surface (or lower surface) of each member (or unit) may be defined based on a direction in which the image IM is displayed. The front surface and the rear surface may be parallel to each other in the third direction DR3, and the normal direction of each of the front surface and the rear surface may be parallel to the third direction DR3. A separation distance between the front surface and the rear surface which is defined along the third direction DR3 may correspond to the thickness of a member (or unit). In addition, in the present disclosure, "in plan view" may be defined as a state viewed in the third direction DR3 and "in a cross-sectional view" may be defined as a state viewed in the first direction DR1 or the second direction DR2. However, directions indicated by the first to third directions DR1, DR2, and DR3 are a relative concept, and may be converted to different directions.

FIG. 1A exemplarily illustrates the display device DD having a planar display surface IS. However, the shape of the display surface IS of the display device DD is not limited thereto, and may be curved or three-dimensional.

The display device DD may be flexible. Being "flexible" refers to having properties of being able to be bent, without damage to any function, to any degree between being completely folded to and being bent to a degree of a few nanometers. Being "flexible" includes both folding of planar surfaces and curving of a surface. For example, the flexible display device DD may be a curved display device or a foldable display device. However, the embodiment of the inventive concept is not limited thereto, and the display device DD may be rigid.

The display surface IS of the display device DD may include a display portion D-DA and a non-display portion D-NDA. The display portion D-DA may be a portion in which the image IM is displayed, and a user may visually recognize the image IM through the display portion D-DA. In the present embodiment, the display portion D-DA is illustrated as having a rectangular shape in plan view, but this is only an example, and the display portion D-DA may have various shapes. "Non-display portion" and "display portion." as used herein, refer to regions on the display module DM that are defined in the plane formed by the first direction DR1 and the second direction DR2. The boundaries of "non-display portion" and "display portion" apply through the thickness direction DR3 orthogonally with respect to the plane formed by the first direction DR1 and the second direction DR2 for the entire thickness of the display module DM, such that many layers are in each of the "non-display portion" and "display portion."

The non-display portion D-NDA may be a portion which does not display the image IM. The non-display portion D-NDA may be a portion which has a predetermined color and which blocks light. The non-display portion D-NDA may be adjacent to the display portion D-DA. For example, the non-display portion D-NDA may be disposed on the outside of the display portion D-DA and surround the display portion D-DA. However, this is only exemplary, and the non-display portion D-NDA may be adjacent to only one side of the display portion D-DA, or may be disposed on the side surface, not the front surface, of the display device DD, but the embodiment of the inventive concept is not limited thereto, and the non-display portion D-NDA may be omitted.

The display device DD of an embodiment may sense an external input applied from outside. The external input may have various forms such as pressure, temperature, and light provided from the outside. The external input may include not only an input which comes into contact with the display device DD (e.g., a contact by a user's hand or a pen), but also an input applied in close proximity to the display device DD (e.g., hovering).

Referring to FIG. 1B, the display device DD may include a window WM, a display module DM, and an external case HAU. The display module DM may include a display panel DP and a light control member LCM.

The window WM and the external case HAU may be coupled to define the outer shape of the display device DD, and may provide an internal space capable of accommodating components of the display device DD, such as the display module DM.

The window WM may be disposed on the display module DM. The window WM may protect the display module DM from external impact. The front surface of the window WM may correspond to the display surface IS of the display device DD. The front surface of the window WM may include a transmission region TA and a bezel region BA.

The transmission region TA of the window WM may be an optically transparent region. The window WM may transmit an image provided by the display module DM through the transmission region TA, and a user may visually recognize the image. The transmission region TA may correspond to the display portion D-DA of the display device DD.

The window WM may include an optically transparent insulative material. For example, the window WM may include glass, sapphire, plastic, or the like. The window WM may have a single-layered structure or a multi-layered structure. The window WM may further include a functional layer such as an anti-fingerprint layer, a phase control layer, and a hard coating layer disposed on an optically transparent substrate.

The bezel region BA of the window WM may be a region formed by depositing, coating, or printing a material having a predetermined color on the optically transparent substrate. The bezel region BA of the window WM may prevent a component of the display module DM overlapping the bezel region BA from being visually recognized from the outside. The bezel region BA may correspond to the non-display portion D-NDA of the display device DD.

The display module DM may be disposed between the window WM and the external case HAU, and is sized to fit in the space created by coupling of the window WM to the external case HAU. The display module DM may display an image according to an electrical signal. The display module DM may include a display region DA and a peripheral region NDA adjacent to the display region DA.

The display region DA may be a region activated according to the electrical signal. The display region DA may be a region which emits the image provided from the display module DM. The display region DA of the display module DM may overlap transmission region TA. Meanwhile, as used herein, when "a region/portion overlaps a region/portion," it is not limited to having the same area and/or the same shape. The image displayed in the display region DA may be visually recognized from the outside through the transmission region TA.

The peripheral region NDA may be adjacent to the display region DA. For example, the peripheral region NDA may surround the display region DA. However, the embodiment of the inventive concept is not limited thereto, and the peripheral region NDA may be defined in various shapes. The peripheral region NDA may be a region in which a driving circuit or a driving line for driving elements disposed in the display region DA, various signal lines for providing an electrical signal, and pads may be disposed. The peripheral region NDA of the display module DM may overlap bezel region BA. Components of the display module DM disposed in the peripheral region NDA may be prevented from being visually recognized from the outside by the bezel region BA.

The display panel DP according to an embodiment may be a light emitting type display panel, but is not particularly limited thereto. For example, the display panel DP may be an organic light emitting display panel, an inorganic light emitting display panel, or a quantum dot light emitting display panel. A light emitting layer of the organic light emitting display panel may include an organic light emitting material, and a light emitting laver of the inorganic light emitting display panel may include an inorganic light emitting material. A light emitting layer of the quantum dot light emitting display panel may include a quantum dot, a quantum load, and the like. Hereinafter, the display panel DP will be described as an organic light emitting display panel.

The light control member LCM may be disposed on the display panel DP. The light control member LCM may be coupled to the display panel DP through a bonding process after being provided on the display panel DP. The light control member LCM may convert the wavelength of light provided from the display panel DP, or may selectively transmit light provided from the display panel DP. Also, the light control member LCM may prevent the reflection of external light incident from the outside of the display device DD.

The external case HAU may be disposed below the display module DM to accommodate the display module DM. The external case HAU may absorb impacts applied to the display module DM from the outside, and prevent foreign substances/moisture and the like from penetrating into the display module DM to protect the display module DM. The external case HAU may be provided in the form in which a plurality of housing members are coupled to each other.

In an embodiment, the display device DD may further include an input sensing module disposed on the display module DM. The input sensing module may obtain the coordinate information of an external input applied from the outside. The input sensing module may be, but is not limited to, directly disposed on the display module DM through a continuous process, or may be manufactured separately from the display module DM and then attached to the display module DM by an adhesive layer. The input sensing module of an embodiment may be disposed between components of the display module DM. For example, the input sensing module may be disposed between the display panel DP and the light control member LCM.

The display device DD may have an electronic module including various functional modules for operating the display module DM, a power supply module for supplying power required for the display device DD, a bracket coupled to the display module DM and/or the external case HAU and to divide the internal space of display device DD, and the like.

Figure 2:
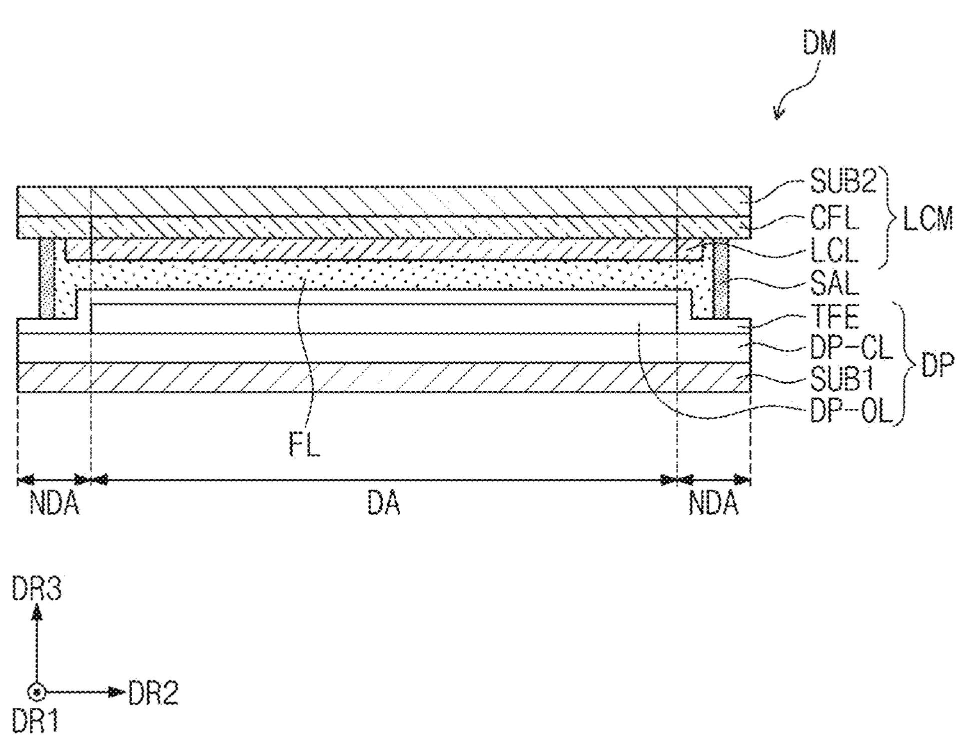
FIG. 2 is a cross-sectional view of a display module according to an embodiment of the inventive concept.

FIG. 2 is a cross-sectional view of a display module DM according to an embodiment of the inventive concept. Referring to FIG. 2, the display module DM may include the display panel DP and the light control member LCM, and the description of each component may be the same as described above.

The display panel DP may include a first substrate SUB1 (or a lower substrate), a circuit layer DP-CL, a light emitting element layer DP-OL, and an encapsulation layer TFE.

The first substrate SUB1 may include a glass substrate, a polymer substrate, or an organic/inorganic composite material substrate. The first substrate SUB1 may include an upper surface and a lower surface parallel to each of the first direction DR1 and the second direction DR2. The circuit layer DP-CL, the light emitting element layer DP-OL, and the encapsulation layer TFE may be formed sequentially stacked on the upper surface of the first substrate SUB1.

The light emitting element layer DP-OL may include light emitting elements disposed in the display region DA. The circuit layer DP-CL may be disposed between the light emitting element layer DP-OL and the first substrate SUB1, and include driving elements, signal lines, and signal pads respectively connected to the light emitting elements. The light emitting elements of the light emitting element layer DP-OL may provide a source light toward the light control member LCM in the display region DA.

The encapsulation layer TFE may be disposed on the light emitting element layer DP-OL, and encapsulate the light emitting elements. The encapsulation layer TFE may include a plurality of thin films. The thin films of the encapsulation layer TFE may be disposed to improve optical efficiency of the light emitting elements, or protect the light emitting elements.

The light control member LCM may include a second substrate SUB2 (or an upper substrate), a color filter layer CFL, and a light conversion layer LCL.

The second substrate SUB2 may include a glass substrate, a polymer substrate, or an organic/inorganic composite material substrate. The second substrate SUB2 may include a rear surface facing the upper surface of the first substrate SUB1. The color filter layer CFL and the light conversion layer LCL may be formed sequentially stacked on the rear surface of the second substrate SUB2.

The light conversion layer LCL may overlap the display region DA, and may include light conversion portions configured to convert optical properties of the source light provided by the light emitting elements. The light conversion layer LCL may selectively convert the color of the source light or transmit the same. A portion of the light conversion layer LCL may overlap the peripheral region NDA.

The color filter layer CFL may overlap the display region DA, and transmit light selectively converted or transmitted by the light conversion layer LCL. The color filter layer CFL may prevent the color purity of the display device DD from being degraded by absorbing light which has passed through the light conversion layer LCL without being converted thereby. A portion of the color filter layer CFL may overlap the peripheral region NDA, and may absorb light either emitted or reflected through the peripheral region NDA. The color filter layer CFL may prevent the reflection of external light incident toward the display panel DP from the outside.

The display module DM may include a sealing member SAL and a filling member FL disposed between the display panel DP and the light control member LCM.

The sealing member SAL may be disposed between display panel DP and the light control member LCM to couple the display panel DP and the light control member LCM. The sealing member SAL may overlap the peripheral region NDA. The sealing member SAL may include an ultraviolet curing material. By different processes from each other, some components of the display panel DP may be provided on the first substrate SUB1, and some components of the light control member LCM may be provided on the second substrate SUB2, and then the first substrate SUB1 and the second substrate SUB2 may be bonded together by the sealing member SAL.

The filling member FL may be disposed between the light conversion layer LCL and the encapsulation layer TFE. The filling member FL may include silicone-based, epoxy-based, or acrylic thermosetting material. However, the material of the filling member FL is not limited thereto.

In the bonding process by the sealing member SAL, the filling member FL may be disposed on the light conversion layer LCL formed on the second substrate SUB2. Thereafter, the display panel DP may be provided on the filling member FL, and the display panel DP and the light control member LCM may be bonded to each other. The filling member FL may fill a space between the first substrate SUB1 and the second substrate SUB2 in the display region DA. In the bonding process, a portion of the filling member FL may flow toward the peripheral region NDA.

Figure 3:
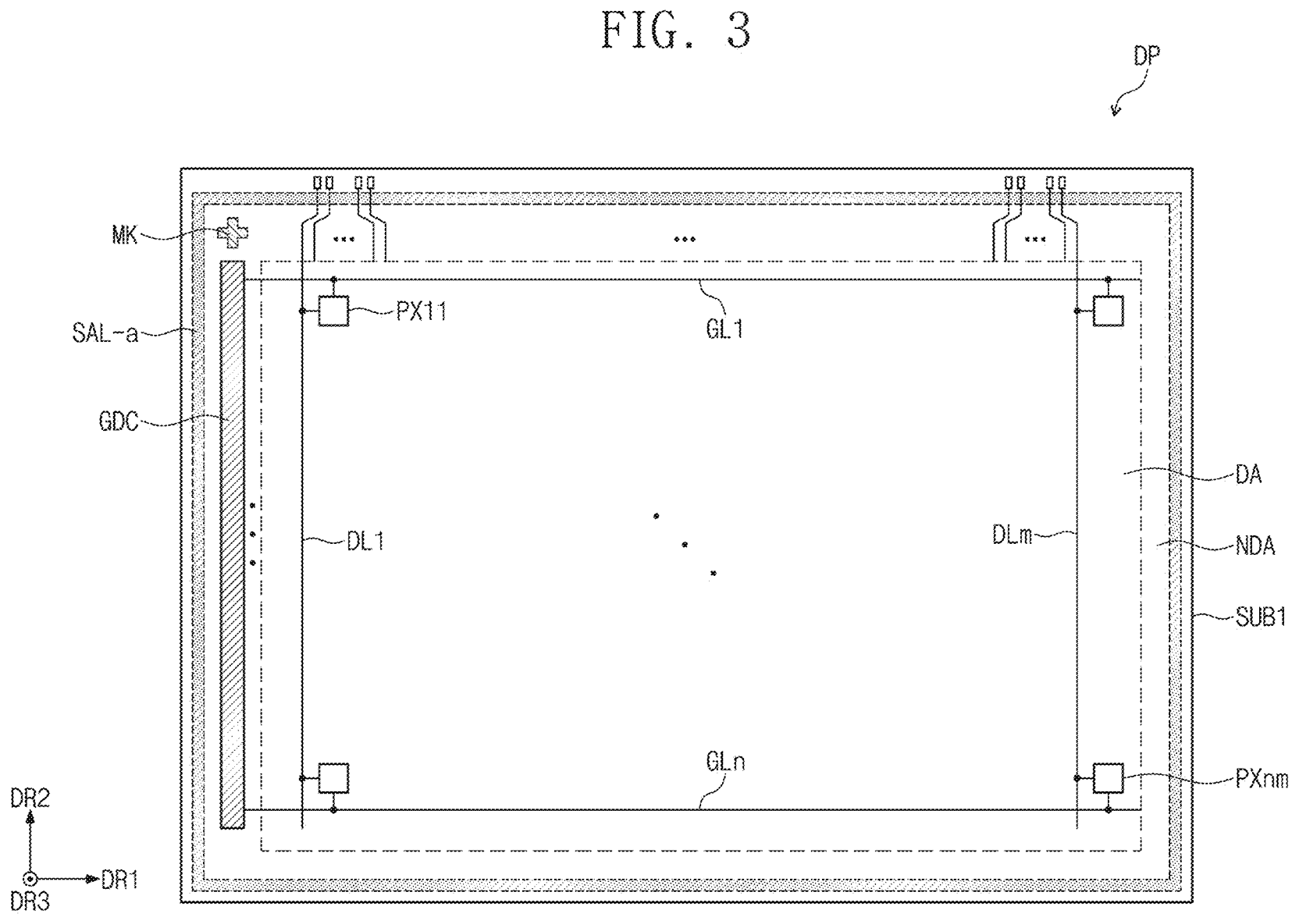
Figure 4A:
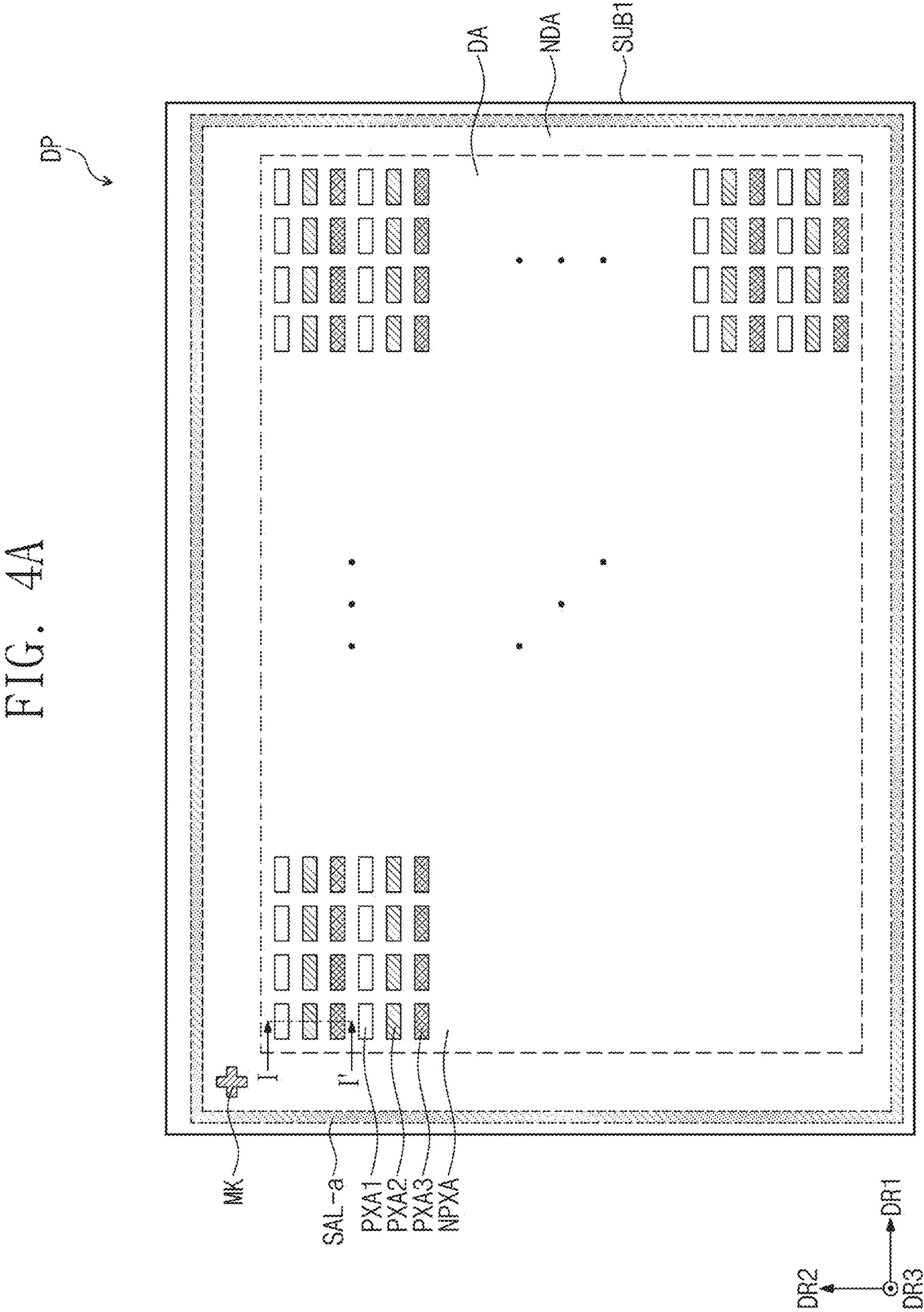
FIG. 4A is a plan view of a display panel according to an embodiment of the inventive concept.
Figure 4B:
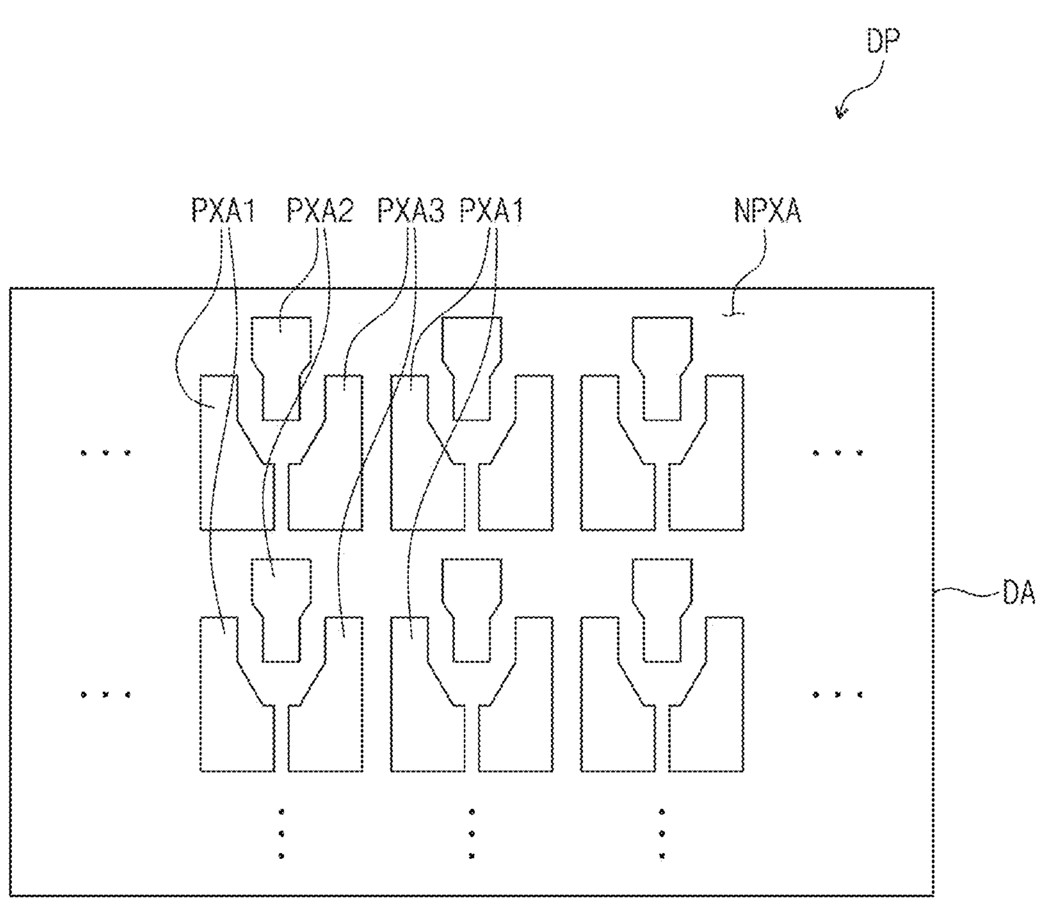
FIG. 4B is an enlarged plan view of a display panel according to an embodiment of the inventive concept.
Figure 4B:
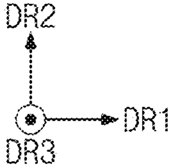
Figure 4C:
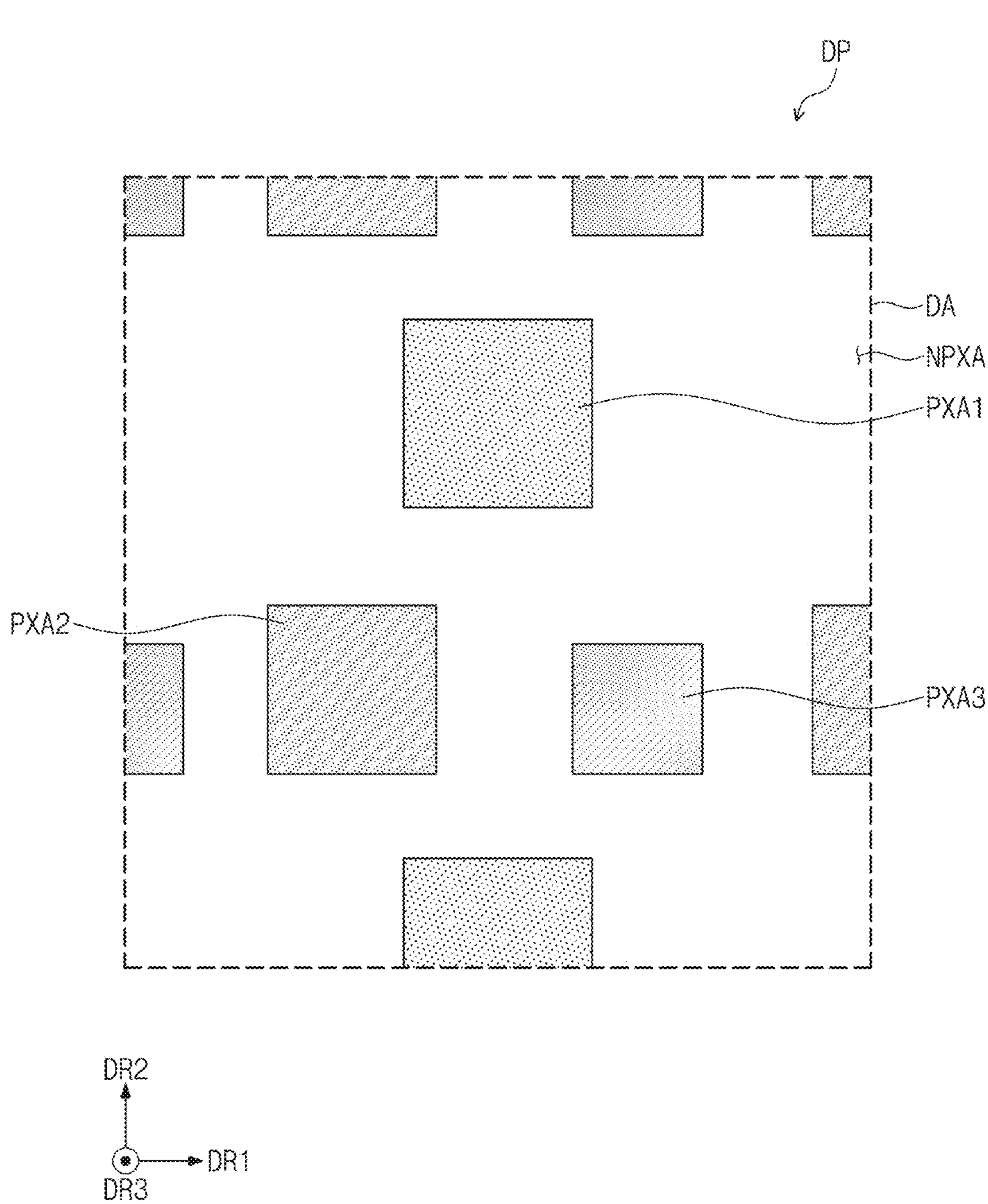
FIG. 4C is an enlarged plan view of a display panel according to an embodiment of the inventive concept.

FIG. 3 is a plan view of a display panel DP according to an embodiment of the inventive concept. FIG. 4A is a plan view of a display panel DP according to an embodiment of the inventive concept. FIG. 4B and FIG. 4C are enlarged plan views of a display panel DP according to an embodiment of the inventive concept.

Referring to FIG. 3, the first substrate SUB1 of the display panel DP may include the display region DA and the peripheral region NDA. The display panel DP may include pixels PX11 to PXnm disposed in the display region DA and signal lines GL1 to GLn and DL1 to DLm electrically connected to the pixels PX11 to PXnm. The display panel DP may include a driving circuit GDC and pads disposed in the peripheral region NDA.

Each of the pixels PX11 to PXnm may include a pixel driving circuit composed of a light emitting element and a plurality of transistors (e.g., a switching transistor, a driving transistor, etc.) connected to the light emitting element to be described later. The pixels PX11 to PXnm may emit light in correspondence to an electrical signal applied to the pixels PX11 to PXnm. FIG. 3 exemplarily illustrates the pixels PX11 to PXnm arranged in a matrix configuration, but the arrangement form of the pixels PX11 to PXnm is not limited thereto.

The signal lines GL1 to GLn and DL1 to DLm may include gate lines GL1 to GLn and data lines DL1 to DLm. Each of the pixels PX11 to PXnm is connected to a corresponding gate line among the gate lines GL1 to GLn and to a corresponding data line among the data lines DL1 to DLm. Depending on the configuration of the pixel driving circuit of the pixels PX11 to PXnm, more types of signal lines may be provided in the display panel DP.

The driving circuit GDC may include a gate driving circuit. The gate driving circuit generates gate signals, and may sequentially output the gate signals to the gate lines GL1 to GLn. The gate driving circuit may further output another control signal to the pixel driving circuit of the pixels PX11 to PXnm.

The pads may be arranged along one direction on the peripheral region NDA. The pads may be portions connected to a circuit board. Each of the pads may be connected to a corresponding signal line among the signal lines GL1 to GLn and DL1 to DLm, and may be connected to a corresponding pixel through the signal line. The pads and the signal lines GL1 to GLn and DL1 to DLm may have a single body shape. However, the embodiment of the inventive concept is not limited thereto, and the pads may be disposed on a different layer from the signal lines GL1 to GLn and DL1 to DLm, and connected thereto through a contact hole.

FIG. 3 and FIG. 4A exemplarily illustrate a sealing member placement region SAL-a in plan view. The sealing member placement region SAL-a may occupy a portion of the peripheral region NDA. The sealing member placement region SAL-a is adjacent to the edge of the display panel DP, and may surround the display region DA as though to form a border along the edge of the display panel DP. The sealing member placement region SAL-a may be defined further outside than the driving circuit GDC.

The display panel DP may include an alignment pattern MK disposed on the peripheral region NDA of the first substrate SUB1. FIG. 3 and FIG. 4A exemplarily illustrate the alignment pattern MK disposed at an upper-left corner of the display panel DP. However, as long as the alignment pattern MK is spaced apart from the pixels PX11 to PXnm in plan view, the position thereof not limited to any one position.

The alignment pattern MK may have various shapes such as a polygonal shape and a circular shape. FIG. 3 and FIG. 4A exemplarily illustrate the alignment pattern MK having a cross shape, but the shape of the alignment pattern MK is not limited thereto.

The alignment pattern MK may include a metal material. The alignment pattern MK may be simultaneously formed in a process of forming a conductive pattern included in the display panel DP.

The alignment pattern MK may be disposed between the sealing member placement region SAL-a and the display region DA in plan view. That is, the alignment pattern MK may be disposed further inside of the first substrate SUB1 than a sealing member to be described later. In a process of cutting a plurality of display panels DP formed in one large mother substrate into separate display panels DP, the alignment pattern MK may act as an align-key which indicates the position of the display panel DP. If the alignment pattern MK is disposed between the sealing member placement region SAL-a and the outer edge of the first substrate SUB1, the alignment pattern MK may accidentally be cut in the process of cutting the mother substrate. If the alignment pattern MK gets cut away, it will not act as an align-key indicating the position of the display panel DP.

Referring to FIG. 4A, the display panel DP may include light emitting regions PXA1, PXA2, and PXA3 corresponding to the light emitting elements disposed in the display region DA, and the non-light emitting region NPXA surrounding the light emitting regions PXA1, PXA2, and PXA3.

The light emitting regions PXA1, PXA2, and PXA3 may correspond to regions from which light provided from a light emitting element is emitted. The light emitting regions PXA1, PXA2, and PXA3 may include a first light emitting region PXA1, a second light emitting region PXA2, and a third light emitting region PXA3. The first to third light emitting regions PXA1, PXA2, and PXA3 may be distinguished according to the color of light emitted toward the outside of the display device DD. The non-light emitting region NPXA sets boundaries of the first to third light emitting regions PXA1, PXA2, and PXA3, may prevent color mixing between the first to third light emitting regions PXA1, PXA2, and PXA3.

One of the first to third light emitting regions PXA1, PXA2, and PXA3 may provide a first color light corresponding to a source light provided by a light emitting element, another one may provide a second color light different from the first color light, and the third one may provide a third color light different from the first color light and the second color light. For example, the first color light may be blue light, the second color light may be red light, and the third color light may be green light.

The first to third light emitting regions PXA1. PXA2, and PXA3 may be disposed in a repeating pattern while having a predetermined arrangement in the display region DA. Referring to FIG. 4A, each of the first to third light emitting regions PXA1, PXA2, and PXA3 is provided in plurality and each of the first light emitting regions PXA1, the second light emitting regions PXA2, and the third light emitting regions PXA3 may be arranged along the first direction DR1 such that each row is of a single color light. The first light emitting regions PXA1, the second light emitting regions PXA2, and the third light emitting regions PXA3 may be arranged along the second direction DR2, for example in a repeating pattern. The arrangement pattern of the first to third light emitting regions PXA1, PXA2, and PXA3 illustrated in FIG. 4A is only exemplary, and depending on the design of the display device DD, the pattern of arrangement of the light emitting regions may vary.

The first to third light emitting regions PXA1. PXA2, and PXA3 may have the same size and dimensions as one another in plan view. However, the embodiment of the inventive concept is not limited thereto, and the first to third light emitting regions PXA1, PXA2, and PXA3 may include two or more light emitting regions of difference sizes.

The first to third light emitting regions PXA1, PXA2, and PXA3 may have various shapes in plan view. FIG. 4A exemplarily illustrates the first to third light emitting regions PXA1, PXA2, and PXA3 each having a rectangular shape in plan view. However, the embodiment of the inventive concept is not limited thereto, and the first to third light emitting regions PXA1, PXA2, and PXA3 may each have the shape of a circle or a polygon.

The first to third light emitting regions PXA1, PXA2, and PXA3 may have the same shape and dimensions as each other in plan view. However, the embodiment of the inventive concept is not limited thereto, and the first to third light emitting regions PXA1, PXA2, and PXA3 may include two or more light emitting regions of different shapes.

FIG. 4B and FIG. 4C exemplarily illustrate first to third light emitting regions PXA1, PXA2, and PXA3 having different shapes from the embodiments of the first to third light emitting regions PXA1, PXA2, and PXA3 illustrated in FIG. 4A.

Referring to FIG. 4B, the first and third light emitting regions PXA1 and PXA3 may have the same polygonal shape (arranged in mirror image of each other) in plan view. The first light emitting region PXA1 may have a shape symmetrical to the shape of the third light emitting region PX3 based on a virtual axis extending between them in the second direction DR2. The second light emitting region PXA2 may be a different polygonal shape from the first and third light emitting regions PXA1 and PXA3. In the example embodiment of FIG. 4B, the second light emitting region PXA2 is symmetrical with respect to the virtual axis that extends in the second direction DR2 between the first and the third light emitting regions PXA1, PXA3.

Each of the first light emitting regions PXA1 and the third light emitting regions PXA3 may be arranged along the first direction DR1 and the second direction DR2. The first light emitting regions PXA1 and the third light emitting regions PXA3 may be alternately arranged with each other along the first direction DR1. Each of the second light emitting regions PXA2 may be arranged between the first light emitting region PXA1 and the third light emitting region PXA3 along the first direction DR1 and the second direction DR2.

Referring to FIG. 4C, in an embodiment, each of the first and third emitting regions PXA1, PXA1 and PXA3 may have the same shape as each other in plan view, and different planar areas from each other. FIG. 4C exemplarily illustrates the first to third light emitting regions PXA1, PXA2, and PXA3 each having a rectangular shape but of different dimensions from each other. FIG. 4C illustrates the first to third light emitting regions PXA1, PXA2, and PXA3 each having a shape with right-angled corners, but the embodiment of the inventive concept is not limited thereto, and the first to third light emitting regions PXA1, PXA2, and PXA3 may each have a shape with substantially round corners.

The planar area of each of the first to third light emitting regions PXA1, PXA2, and PXA3 may be set in accordance with the color of emitted light. For example, among major colors, the planar area of a light emitting region emitting green light may be the largest, and the planar area of a light emitting region emitting blue light may be the smallest. However, the embodiment is not necessarily limited thereto, and the size of light emitting region for each color may vary depending on the structure of the display panel DP.

The first light emitting regions PXA1 arranged along the first direction DR1 may be defined as one row (hereinafter, a first row). The second light emitting regions PXA2 and the third light emitting regions PXA3 arranged along the first direction DR1 may be defined as another row (hereinafter, a second row). In the second row, the second light emitting regions PXA2 and the third light emitting regions PXA3 may be alternately arranged with each other along the first direction DR1.

The first row defined by the first light emitting regions PXA1 arranged along the first direction DR1 may be provided in plurality, and the plurality of first rows may be arranged along the second direction DR2. In the same manner, the second row defined by the second light emitting regions PXA2 and the third light emitting regions PXA3 alternately arranged along the first direction DR1 may be provided in plurality, and the plurality of second rows may be arranged along the second direction DR2. As illustrated in FIG. 4C, the first row and the second row may be alternately arranged with each other along the second direction DR2.

Meanwhile, the shapes, the planar areas, and arrangements of light emitting regions may be designed in various ways in accordance with light emitting efficiency according to a color.

Figure 5A:
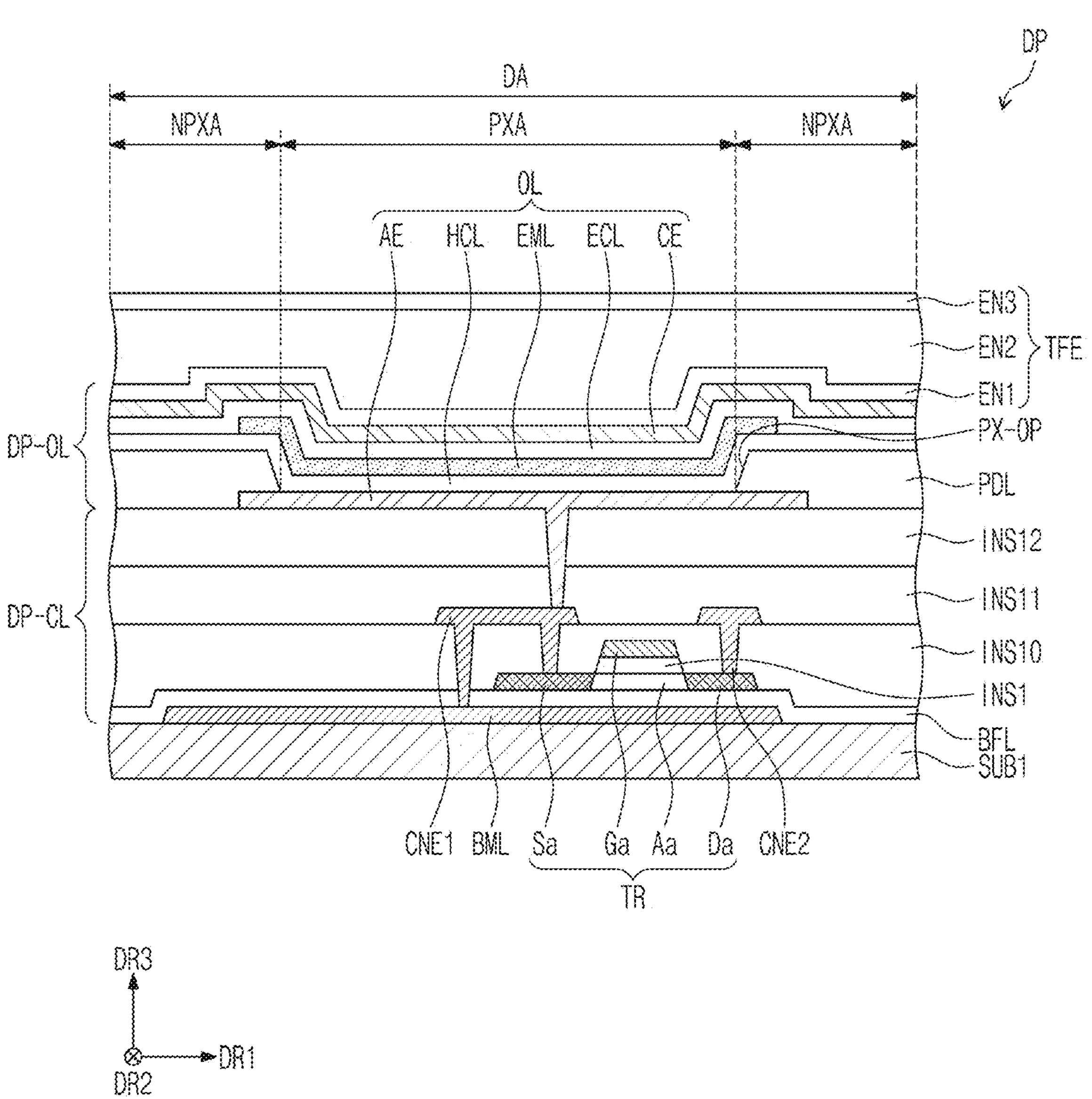
FIG. 5A and FIG. 5B are cross-sectional views of a display panel according to an embodiment of the inventive concept.
Figure 5B:
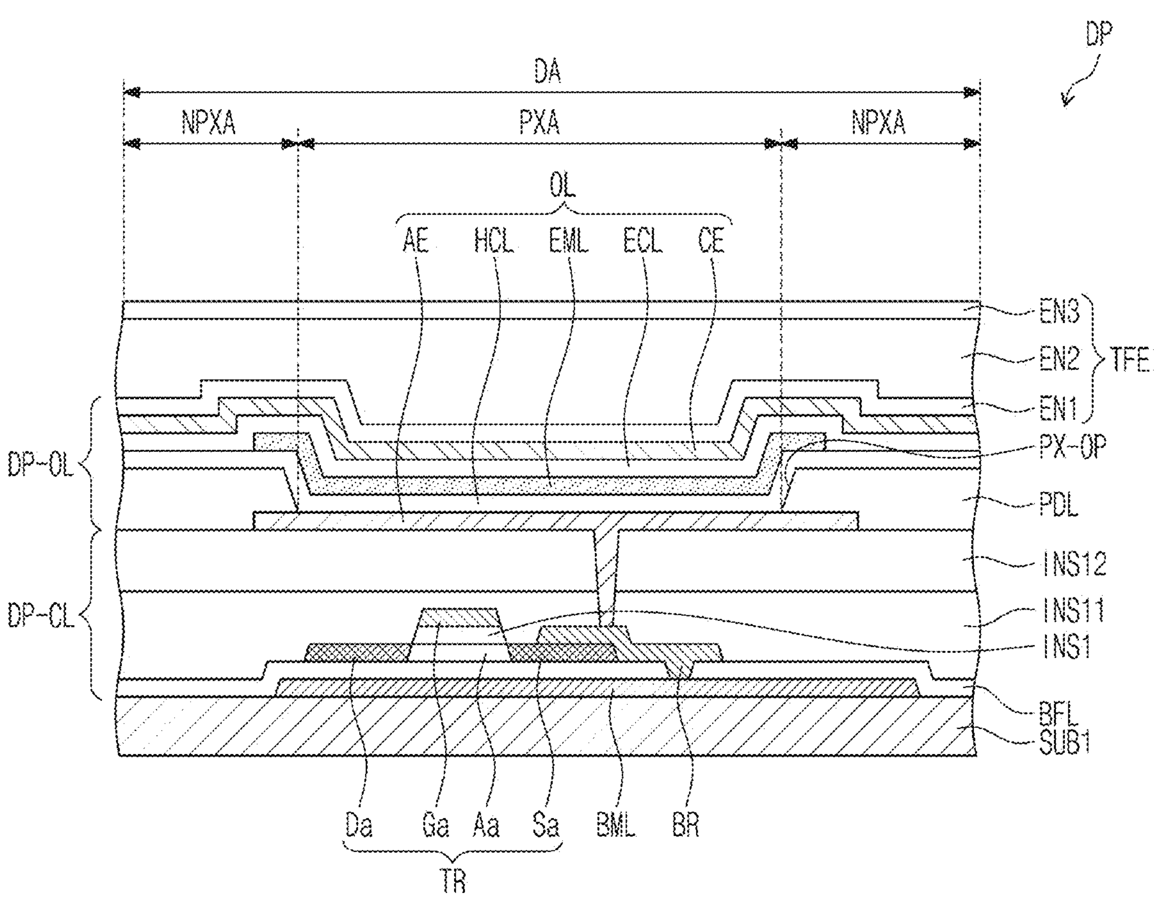
Figure 5B:
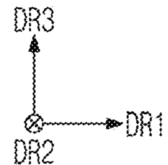

FIG. 5A and FIG. 5B are cross-sectional views of a display panel DP according to an embodiment of the inventive concept. FIG. 5A and FIG. 5B exemplarily illustrate cross-sections corresponding to one light emitting element OL. The display panel DP may include the first substrate SUB1, the circuit layer DP-CL, the light emitting element layer DP-OL, and the encapsulation layer TFE, and the description of each component may be the same as described above.

The display panel DP may include an insulation layer, a semiconductor pattern, a conductive pattern, a signal line, and the like. In a manufacturing process of the display panel DP, the insulation layer, a semiconductor layer, and a conductive layer may be formed on the first substrate SUB1 by methods such as coating, deposition, and the like. Thereafter, the insulation layer, the semiconductor layer, and the conductive layer may be selectively patterned by a photolithography method. Through the above process, the semiconductor pattern, the conductive pattern, the signal line and the like included in the display panel DP may be formed.

Each pixel may have an equivalent circuit including transistors, a light emitting element, and at least one capacitor, and the equivalent circuit of the pixel may be modified in various forms. The semiconductor pattern may be arranged by predetermined rule across the pixels according to the equivalent circuit. FIG. 5A and FIG. 5B exemplarily illustrate one transistor TR and one light emitting element OL included in a pixel.

Referring to FIG. 5A and FIG. 5B, the first substrate SUB1 may have a single-layered or multi-layered structure. The first substrate SUB1 of a multi-layered structure may include synthetic resin layers and at least one inorganic layer disposed between the synthetic resin layers. For example, a synthetic resin layer of the first substrate SUB1 may include at least one of an acrylic resin, a methacrylic resin, polyisoprene, a vinyl-based resin, an epoxy-based resin, a urethane-based resin, a cellulose-based resin, a siloxane-based resin, a polyimide-based resin, a perylene-based resin, or a polyimide-based resin. However, the material of the first substrate SUB1 is not limited thereto.

The circuit layer DP-CL may be disposed on the first substrate SUB1. The circuit layer DP-CL may include at least one insulation layer, a conductive pattern, and a semiconductor pattern. However, the stacking structure of the circuit layer DP-CL may be variously modified according to a manufacturing process of the circuit layer DP-CL or the configuration of elements included in a pixel. FIG. 5A and FIG. 5B exemplarily illustrate embodiments of the stacking form of the circuit layer DP-CL formed through a different process. However, these are only exemplary, and the circuit layer DP-CL of the inventive concept is not limited to any one embodiment as long as it include driving elements configured to drive a pixel.

Referring to FIG. 5A, the circuit layer DP-CL may include a light blocking pattern BML, the transistor TR, connection electrodes CNE1 and CNE2, and a plurality of insulation layers INS10, INS11, and INS12.

The light blocking pattern BML may be disposed on the first substrate SUB1. The light blocking pattern BML may overlap the transistor TR. The light blocking pattern BML may prevent conductive patterns of the circuit layer DP-CL from being visually recognized by external light, or may prevent a semiconductor pattern of the transistor TR from being damaged by external light.

A buffer layer BFL may be disposed on the first substrate SUB1 to cover the light blocking pattern BML. The buffer layer BFL may have a contact hole which exposes a portion of the light blocking pattern BML. The buffer layer BFL may improve the coupling force between the first substrate layer SUB1 and the semiconductor pattern. The buffer layer BFL may include an inorganic material. For example, the buffer layer BFL may include at least one of aluminum oxide, titanium oxide, silicon oxide, silicon nitride, silicon oxynitride, zirconium oxide, or hafnium oxide. However, the material of the buffer layer BFL is not limited thereto.

The semiconductor pattern of the transistor TR may be disposed on the buffer layer BFL. The semiconductor pattern may include polysilicon. However, the embodiment of the inventive concept is not limited thereto, and the semiconductor pattern may include amorphous silicon, crystalline oxide, or amorphous oxide.

A source region Sa, a drain region Da, and a channel region Aa of the transistor TR may be formed from the semiconductor pattern. The semiconductor pattern may be divided into a plurality of regions according to conductivity. For example, the semiconductor pattern may have different electrical properties depending on whether the semiconductor pattern is doped or a metal oxide is reduced. In the semiconductor pattern, a region having a large conductivity may serve as an electrode or a signal line, and may correspond to the source region Sa and the drain region Da of the transistor TR. A region that is not doped or not reduced, thereby having a small conductivity, may correspond to the channel region Aa (or an active region) of the transistor TR.

An insulation layer may be formed on the semiconductor pattern of the transistor TR, and then patterned to form an insulation pattern INS1. A gate electrode Ga may be disposed on the insulation pattern INS1. The gate electrode Ga may be used as a mask in a process of forming the insulation pattern INS1. The gate electrode Ga may overlap the channel region Aa, and may be spaced apart from the semiconductor pattern of the transistor TR with the insulation pattern INS1 interposed therebetween.

The plurality of insulation layers INS10, INS11, and INS12 may be disposed on the buffer layer BFL. Each of the plurality of insulation layers INS10, INS11, and INS12 may include at least one inorganic film or organic film. The inorganic film may include at least one of aluminum oxide, titanium oxide, silicon oxide, silicon nitride, silicon oxynitride, zirconium oxide, or hafnium oxide, but is not limited to the above materials. The organic film may include a phenolic polymer, an acrylic polymer, an imide-based polymer, an aryl ether-based polymer, an amide-based polymer, a fluorine-based polymer, a p-xylene-based polymer, a vinyl alcohol-based polymer, and a combination thereof, but is not limited to the above materials.

A first insulation layer INS10 is disposed on the buffer layer BFL, and may cover the gate electrode Ga. The first insulation layer INS10 may have a contact hole which exposes a portion of the semiconductor pattern of the transistor TR.

The connection electrodes CNE1 and CNE2 may be disposed on the first insulation layer INS10. A first connection electrode CNE1 may be connected to the source region Sa of the transistor TR through a contact hole passing through the first insulation layer INS10. In an embodiment, the first connection electrode CNE1 may be connected to the light blocking pattern BML through a contact hole extending through the first insulation layer INS10 and the buffer layer BFL. A second connection electrode CNE2 may be connected to the drain region Da of the transistor TR through a contact hole extending through the first insulation layer INS10. The second connection electrode CNE2 may extend in plan view and connect to another transistor or signal line.

The second insulation layer INS11 and the third insulation layer INS12 may be disposed on the first insulation layer INS10 to cover the connection electrodes CNE1 and CNE2. The second insulation layer INS11 and the third insulation layer INS12 may have a penetration hole which exposes a portion of the first connection electrode CNE1, and the first connection electrode CNE1 may be connected to a first electrode AE of the light emitting element OL disposed on the third insulation layer INS12. In an embodiment, the third insulation laver INS12 includes an organic film, and may provide a flat upper surface. However, the embodiment of the inventive concept is not necessarily limited thereto.

However, depending on the structures, placements, and manufacturing process of elements, some of the plurality of insulation layers INS10, INS11, and INS12 in the circuit layer DP-CL may be omitted. Referring to FIG. 5B, in an embodiment, the circuit layer DP-CL may include the light blocking pattern BML, the transistor TR, a bridge pattern BR, and a plurality of insulation layers INS11 and INS12.

The bridge pattern BR is disposed on the semiconductor pattern, and may be connected to the source region Sa of the transistor TR. The bridge pattern BR may be connected to the light blocking pattern BML through a contact hole passing through the buffer layer BFL. Through the bridge pattern BR, the transistor TR may be electrically connected to other elements of the circuit layer DP-CL.

In an embodiment, the first insulation layer INS10 of FIG. 5A may be omitted, and the second insulation layer INS11 and the third insulation layer INS12 may be disposed on the buffer layer BFL while covering the transistor TR and the bridge pattern BR. The second insulation layer INS11 and the third insulation layer INS12 may have a penetration hole which exposes a portion of the bridge pattern BR, and the bridge pattern BR may be connected to the first electrode AE of the light emitting element OL disposed on the third insulation layer INS12.

In an embodiment, the first insulation layer INS10 and components of a connection electrode disposed on the first insulation layer INS10 may be omitted. Accordingly, a process of forming a contact hole in the first insulation layer INS10, or forming connection electrodes disposed on the first insulation layer INS10 through patterning may be omitted, and depending on an embodiment, a process of forming the circuit layer DP-CL may be simplified.

Referring back to FIG. 5A and FIG. 5B, the light emitting element layer DP-OL may be disposed on the circuit layer DP-CL. The light emitting element layer DP-OL may include a plurality of light emitting elements OL and a pixel definition film PDL, and FIGS. 5A and 5B illustrate a cross-section corresponding to one light emitting element OL among the plurality of light emitting elements OL.

The display region DA may include a light emitting region PXA corresponding to the light emitting element OL, and a non-light emitting region NPXA surrounding the light emitting region PXA. The light emitting element OL may include the first electrode AE, a hole control layer HCL, a light emitting layer EML, an electron control layer ECL, and a second electrode CE.

The pixel definition film PDL may be disposed on the third insulation layer INS12. The pixel definition film PDL may have an opening PX-OP which exposes a portion of the first electrode AE. The pixel definition film PDL may cover a portion of an upper surface of the first electrode AE. In the present embodiment, the portion of the first electrode AE exposed by the opening PX-OP may correspond to the light emitting region PXA. A region in which the pixel definition film PDL is disposed may correspond to the non-light emitting region NPXA surrounding the light emitting region PXA.

The pixel definition film PDL may include an organic material. The pixel definition film PDL of an embodiment may have a predetermined color. For example, the pixel definition film PDL may include a base resin, and a black pigment and/or a black dye mixed with the base resin. However, the embodiment of the pixel definition film PDL is not limited thereto.

The hole control layer HCL may be disposed on the first electrode AE and the pixel definition film PDL. The hole control layer HCL may be commonly disposed in a plurality of pixels. The hole control layer HCL may overlap the light emitting region PXA and the non-light emitting region NPXA. The hole control layer HCL may include at least one of a hole transport layer and a hole injection layer.

The light emitting layer EML may be disposed on the hole control layer HCL. The light emitting layer EML may be disposed in a region corresponding to the opening PX-OP of the pixel definition film PDL. The light emitting layer EML may include an organic light emitting material, an inorganic light emitting material, a quantum dot, a quantum rod, or the like. The light emitting layer EML may be divided and formed in each of the pixels. However, the embodiment of the inventive concept is not limited thereto, and the light emitting layer EML may be commonly formed in the pixels. The light emitting layer EML may generate a first light which is a source light. For example, the first light may be blue light.

However, the embodiment of the inventive concept is not limited thereto, and in an embodiment, the light emitting element OL may be a light emitting element of a tandem structure including a plurality of light emitting layers. The plurality of light emitting layers may be stacked on the first electrode AE along a thickness direction (e.g., the third direction DR3). Some of the plurality of light emitting layers may substantially generate the same color light, and the rest thereof may generate different color light. For example, the light emitting element OL of an embodiment may include four light emitting layers, and three light emitting layers of the four light emitting layers may generate blue light, and one light emitting layer thereof may generate green light. However, this is only exemplary, and the embodiment of the inventive concept is not necessarily limited thereto. The light emitting element of a tandem structure may further include functional layers such as a hole control layer, an electron control layer, and a charge generation layer disposed between the plurality of light emitting layers.

The electron control layer ECL may be disposed on the light emitting layer EML. The electron control layer ECL may be commonly disposed in a plurality of pixels. The electron control layer ECL may overlap the light emitting region PXA and the non-light emitting region NPXA. The electron control layer ECL may include at least one of an electron transport layer and an electron injection layer.

The second electrode CE may be disposed on the electron control layer ECL. The second electrode CE may be commonly disposed in a plurality of pixels. The second electrode CE may overlap the light emitting region PXA and the non-light emitting region NPXA. The second electrode CE may be provided with a common voltage, and the second electrode CE may be referred as a common electrode.

A first voltage may be applied to the first electrode AE through the transistor TR, and a common voltage may be applied to the second electrode CE. A hole and an electron injected into the light emitting layer EML are combined to form an exciton, and when the exciton transits to a ground state, the light emitting element OL may emit light.

The encapsulation layer TFE may be disposed on the light emitting element layer DP-OL to encapsulate the light emitting element layer DP-OL. The encapsulation layer TFE may include first to third encapsulation films EN1, EN2, and EN3. The first encapsulation film EN1 may be disposed on the second electrode CE, and the second encapsulation film EN2 and the third encapsulation film EN3 may be sequentially disposed on the first encapsulation film EN1.

In an embodiment, the first and third encapsulation films EN1 and EN3 may include an inorganic film. The inorganic film may protect the light emitting element layer DP-OL from moisture and/oxygen. For example, the inorganic film may include at least one of aluminum oxide, titanium oxide, silicon oxide, silicon nitride, silicon oxynitride, zirconium oxide, or hafnium oxide, but is not limited thereto.

In an embodiment, the second encapsulation film EN2 may include an organic film. The organic film may protect the light emitting element layer DP-OL from foreign substances such as dust particles. For example, the organic film may include an acrylic resin, but is not limited thereto.

Figure 6:
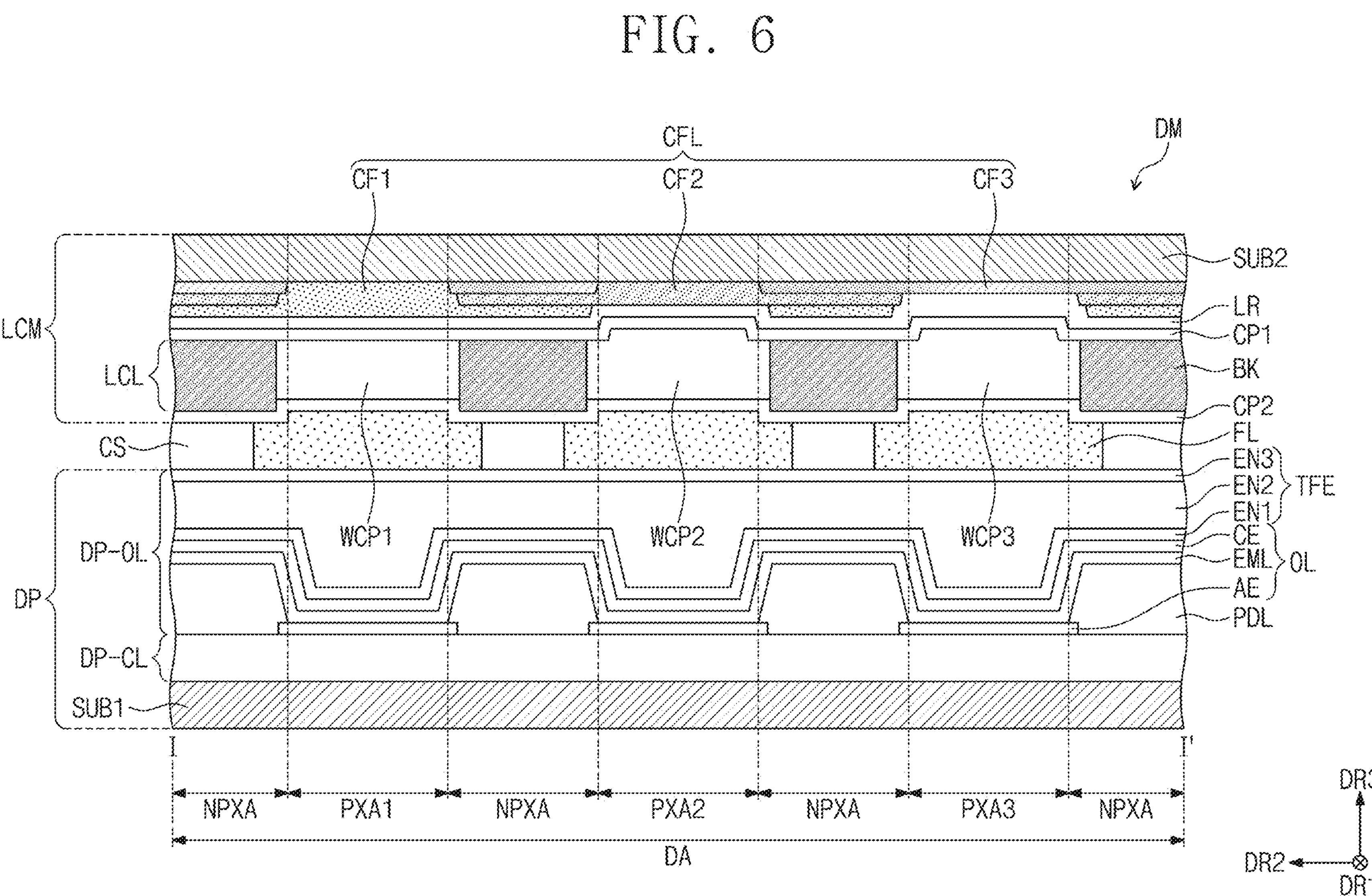
FIG. 6 is a cross-sectional view of a display module according to an embodiment of the inventive concept corresponding to line I-I' illustrated in FIG. 4A.

FIG. 6 is a cross-sectional view of a display module DM taken along line I-I' illustrated in FIG. 4A. FIG. 6 exemplarily illustrates a partial cross-section of the display module DM corresponding to the first to third light emitting regions PXA1, PXA2, and PXA3, and the description of the cross-section of the display module DM of FIG. 6 may be equally applied to the cross-sections of the first to third light emitting regions PXA1, PXA2, and PXA3 illustrated in FIG. 4B and FIG. 4C. The description of each component of the display module DM illustrated in FIG. 6 may be the same as described above.

The light control member LCM may include the second substrate SUB2, the color filter layer CFL, a low refractive layer LR, and the light conversion laver LCL. The light control member LCM may include a first capping layer CP1 disposed on the low refractive layer LR, and a second capping layer CP2 disposed on the light conversion layer LCL. Each of the low refractive laver LR, the first capping layer CP1, and the second capping layer CP2 may be defined as insulation layer.

The rear surface of the second substrate SUB2 may face the upper surface of the first substrate SUB1. The color filter layer CFL, the low refractive layer LR, the first capping layer CP1, the light conversion layer LCL, and the second capping layer CP2 may be sequentially disposed on the rear surface of the second substrate SUB2. That is, in a process of manufacturing the light control member LCM, the rear surface of the second substrate SUB2 may be provided as a base surface on which the color filter layer CFL is formed.

The color filter layer CFL may include a first color filter CF1, a second color filter CF2, and a third color filter CF3. The first to third color filters CF1, CF2, and CF3 may be provided in a patterned form to overlap a corresponding region among the first to third light emitting regions PXA1, PXA2, and PXA3 on the rear surface of the second substrate SUB2. That is, the first to third color filters CF1, CF2, and CF3 may be disposed respectively corresponding to the first to third light emitting regions PXA1, PXA2, and PXA3 in plan view. Specifically, the first color filter CF1 may overlap the first light emitting region PXA1, the second color filter CF2 may overlap the second light emitting region PXA2, and the third color filter CF3 may overlap the third light emitting region PXA3. The first to third color filters CF1, CF2, and CF3 will be described in more detail later.

The low refractive layer LR may be disposed on the rear surface of the second substrate SUB2 to cover a lower surface of the color filter layer CFL. The low refractive layer LR may have a smaller refractive index than the refractive index of each of a first light conversion portion WCP1, a second light conversion portion WCP2, and a transmission portion WCP3. For example, the refractive index of the low refractive layer LR may be about 1.1 to about 1.3. However, the refractive index of the low refractive layer LR is not limited thereto.

The low refractive layer LR may include an organic material. The low refractive layer LR may further include scattering particles dispersed in a resin including the organic material. The low refractive layer LR may improve the light efficiency of the display device DD through the recirculation of light using a refractive index. However, in an embodiment, the low refractive layer LR may be omitted.

The first capping layer CP1 may be disposed on a lower surface of the low refractive layer LR. The first capping layer CP1 may be provided as a base surface on which the light conversion layer LCL is formed, and may protect the light conversion layer LCL. In an embodiment, the first capping layer CP1 may include an inorganic material.

However, the stacking structure of the light control member LCM is not limited to what is illustrated in FIG. 6. For example, the light control member LCM of an embodiment may include the color filter layer CFL, the light conversion layer LCL, and the low refractive layer LR sequentially disposed on the rear surface of the second substrate SUB2. A light control member LCM of another embodiment may include a plurality of low refractive layers. Among the plurality of low refractive layers, one low refractive layer may be disposed between the color filter layer CFL and the light conversion layer LCL, and another low refractive layer may be disposed on a lower surface of the light conversion layer LCL. The stacking order of the color filter layer CFL, the light conversion layer LCL, and the low refractive layer LR which constitute the light control member LCM may be variously modified depending on an embodiment.

The light conversion layer LCL may include the first light conversion portion WCP1, the second light conversion portion WCP2, the transmission portion WCP3, and a bank portion BK. Although FIG. 6 exemplarily illustrates a cross-section in which one first light conversion portion WCP1, one second light conversion portion WCP2, and one transmission portion WCP3 are provided, the first and second light conversion portions WCP1 and WCP2, and the transmission portion WCP3 may be provided in plurality in the display region DA, and the bank portion BK may surround a plurality of first light conversion portions WCP1, a plurality of second light conversion portions WCP2, and a plurality of transmission portions WCP3.

The first light conversion portion WCP1, the second light conversion portion WCP2, and the transmission portion WCP3 may be disposed respectively corresponding to the light emitting regions PXA1, PXA2, and PXA3 in plan view. Specifically, the first light conversion portion WCP1 may overlap the first light emitting region PXA1, the second light conversion portion WCP2 may overlap the second light emitting region PXA2, and the transmission portion WCP3 may overlap the third light emitting region PXA3.

The second capping layer CP2 may cover the lower surface of the light conversion layer LCL. The second capping layer CP2 may prevent moisture or foreign substances from penetrating into the light conversion layer LCL. The second capping layer CP2 of an embodiment may include an inorganic material.

Each of the first light conversion portion WCP1 and the second light conversion portion WCP2 may include a base resin and quantum dots dispersed in the base resin. The quantum dots may convert the wavelength range of a first light provided from the light emitting element OL. For example, the first light conversion portion WCP1 may include first quantum dots which convert the first light into a second light having a different wavelength range from the wavelength range of the first light. The second light conversion portion WCP2 may include second quantum dots which convert the first light into a third light having a different wavelength range from the wavelength range of the first light. Here, the wavelength range of the second light and the wavelength range of the third light may be different from each other.

The light emitting element OL may provide a source light (or the first light) and in an embodiment, the source light may correspond to light provided by stacking light emitting layers emitting blue light and at least one emitting layer emitting green light. The first quantum dots of the first light conversion portion WCP1 may covert the source light incident on the first light conversion portion WCP1 from the light emitting element OL into green light. The second quantum dots of the second light conversion portion WCP2 may covert the source light incident on the second light conversion portion WCP2 from the light emitting element OL into red light. However, the embodiment of the inventive concept is not necessarily limited thereto.

The transmission portion WCP3 may include a base resin. The transmission portion WCP3 may transmit the source light provided from the light emitting element OL. For example, the light emitting element OL may provide blue light, and the blue light may pass through the transmission portion WCP3 and be emitted in a direction toward the front surface of the display module DM. The transmission portion WCP3 of an embodiment may further include scattering particles dispersed in the base resin. The scattering particles of the transmission portion WCP3 may scatter light incident toward the transmission portion WCP3 in various directions.

Accordingly, the display module DM may emit green light though the first light emitting region PXA1, emit red light through the second light emitting region PXA2, and emit blue light through the third light emitting region PXA3. Through the first to third light emitting regions PXA1, PXA2, and PXA3 respectively displaying green, red, and blue, the display module DM may display a predetermined image in the display region DA.

In an embodiment, at least one of the first light conversion portion WCP1 and the second light conversion portion WCP2 may further include scattering particles. The scattering particles may scatter the first light incident on the first and second light conversion portions WCP1 and WCP2 from the light emitting element OL to improve light conversion efficiency by quantum dots in a light conversion unit.

A core of the quantum dots included in the first light conversion portion WCP1 and the second light conversion portion WCP2 may be selected from a Group II-VI compound, a Group III-VI compound, a Group I-III-VI compound, a Group III-V compound, a Group IV-VI compound, a Group IV element, a Group IV compound, and a combination thereof.

The Group II-VI compound may be selected from the group consisting of a binary compound selected from the group consisting of CdSe, CdTe, CdS, ZnS, ZnSe, ZnTe, ZnO, HgS, HgSe, HgTe, MgSe, MgS, and a mixture thereof, a ternary compound selected from the group consisting of CdSeS, CdSeTe, CdSTe, ZnSeS, ZnSeTe, ZnSTe, HgSeS, HgSeTe, HgSTe, CdZnS, CdZnSe, CdZnTe, CdHgS, CdHgSe, CdHgTe, HgZnS, HgZnSe, HgZnTe, MgZnSe, MgZnS, and a mixture thereof, and a quaternary compound selected from the group consisting of HgZnTeS, CdZnSeS, CdZnSeTe, CdZnSTe, CdHgSeS, CdHgSeTe, CdHgSTe, HgZnSeS, HgZnSeTe, HgZnSTe, and a mixture thereof.

The Group III-VI compound may include a binary compound such as In2S3 and In2Se3, a ternary compound such as InGaS3 and InGaSe3, or any combination thereof.

The Group I-III-VI compound may be selected from a ternary compound selected from the group consisting of AgInS, AgInS2, CuTnS, CuTnS2, AgGaS2, CuGaS2 CuGaO2, AgGaO2, AgAlO2, and a mixture thereof, or a quaternary compound such as AgInGaS2 and CuInGaS2.

The Group III-V compound may be selected from the group consisting of a binary compound selected from the group consisting of GaN, GaP, GaAs, GaSb, AlN, AlP, AlAs, ASb, InN, InP, InAs, InSb, and a mixture thereof, a ternary compound selected from the group consisting of GaNP, GaNAs, GaNSb, GaPAs, GaPSb, AlNP, AlNAs, AlNSb, AlPAs, AlPSb, InGaP, InAlP, InNP, InNAs, InNSb, InPAs, InPSb, and a mixture thereof, and a quaternary compound selected from the group consisting of GaAlNP, GaAlNAs, GaAlNSb, GaAlPAs, GaAlPSb, GaInNP, GaInNAs, GaInNSb, GaInPAs, GaInPSb, InAlNP, InAlNAs, InAlNSb, InAlPAs, InAlPSb, and a mixture thereof. Meanwhile, the Group III-V compound may further include a Group II metal. For example, InZnP or the like may be selected as the Group III-II-V compound.

The Group IV-VI compound may be selected from the group consisting of a binary compound selected from the group consisting of SnS, SnSe, SnTe, PbS, PbSe, PbTe, and a mixture thereof, a ternary compound selected from the group consisting of SnSeS, SnSeTe, SnSTe, PbSeS, PbSeTe, PbSTe, SnPbS, SnPbSe, SnPbTe, and a mixture thereof, and a quaternary compound selected from the group consisting of SnPbSSe, SnPbSeTe, SnPbSTe, and a mixture thereof. The Group IV element may be selected from the group consisting of Si, Ge, and a mixture thereof. The Group IV compound may be a binary compound selected from the group consisting of SiC. SiGe, and a mixture thereof.

At this time, a binary compound, a ternary compound, or a quaternary compound may be present in a particle at a uniform concentration, or may be present in the same particle with a partially different concentration distribution.

The quantum dot may have a core-shell structure including a core and a shell surrounding the core. In addition, the quantum dot may have a core/shell structure in which one quantum dot surrounds another quantum dot. The interface between the core and the shell may have a concentration gradient in which the concentration of an element present in the shell becomes lower toward the center.

In an embodiment, the quantum dot may have the above-described core-shell structure including nano-crystals. The shell of the quantum dot may serve as a protection layer to prevent the chemical deformation of the core so as to maintain semiconductor properties, and/or a charging layer to impart electrophoresis properties to the quantum dot. The shell may be a single layer or multi-layers. The interface between the core and the shell may have a concentration gradient in which the concentration of an element present in the shell becomes lower toward the center. Examples of the shell of the quantum dot may include a metal oxide, a non-metal oxide, a semiconductor compound, or a combination thereof.

For example, the metal oxide and the non-metal oxide may include a binary compound such as $SiO_2$, $Al_2O_3$, $TiO_2$, ZnO, MnO, $Mn_2O_3$, $Mn_3O_4$, CuO, FeO, $Fe_2O_3$, $Fe_3O_4$, CoO, $Co_3O_4$, and NiO, or a ternary compound such as $MgAl_2O_4$, $CoFe_2O_4$, $NiFe_2O_4$, and $CoMn_2O_4$, but the materials thereof are not limited thereto.

In addition, the semiconductor compound may include CdS, CdSe, CdTe, ZnS, ZnSe, ZnTe, ZnSeS, ZnTeS, GaAs. GaP, GaSb, HgS, HgSe, HgTe, InAs, InP, InGaP, InSb, AlAs, AlP, AlSb, or the like, but the material thereof is not limited thereto.

The quantum dot may have a full width of half maximum (FWHM) of a light emission wavelength spectrum of about 45 nm or less, preferably about 40 nm or less, more preferably about 30 nm or less, and color purity or color reproducibility may be improved in the above range. In addition, light emitted through such a quantum dot is emitted in all directions, so that a wide viewing angle may be improved.

The disclosure is not limited to any exact form of quantum dot as long as it is a form commonly used in the art, as an example, a quantum dot in the form of spherical, pyramidal, multi-arm, or cubic nanoparticles, nanotubes, nanowires, nanofibers, nanoplate particles.

The quantum dot may control the color of emitted light according to the particle size thereof, and accordingly, the quantum dot may have various light emission colors such as blue, red, green, and the like. Meanwhile, when the above-described light emitting layer EML includes a quantum dot material, the above-described description of the quantum dot may be equally applied to the quantum dot material included in the light emitting layer EML.

The bank portion BK may overlap the non-light emitting region NPXA in plan view. In the bank portion BK, openings respectively corresponding to the first to third light emitting regions PXA1, PXA2, and PXA3 may be defined. The first light conversion portion WCP1, the second light conversion portion WCP2, and the transmission portion WCP3 may be respectively disposed corresponding to the openings defined in the bank portion BK. The bank portion BK may prevent color mixing by setting boundaries between the first light conversion portion WCP1, the second light conversion portion WCP2, and the transmission portion WCP3. The bank portion BK may include a material having a predetermined color. For example, the bank portion BK may include a black dye or a black pigment.

Each of the first to third color filters CF1. CF2, and CF3 may include a base resin, and a pigment or dye dispersed in the base resin. Each of the first to third color filters CF1, CF2, and CF3 may transmit light having a predetermined wavelength range, and may absorb light having a wavelength range other than the predetermined wavelength range. For example, the first to third color filters CF1, CF2, and CF3 may be provided as a red color filter, a green color filter, and a blue color filter. The red color filter may transmit red light, and absorb most of green light and blue light. The green color filter may transmit green light, and absorb most of red light and blue light. The blue color filter may transmit blue light, and absorb most red light and green light.

The first color filter CF1 may be disposed on the first light conversion portion WCP1. The first color filter CF1 may transmit the second light provided from the first light conversion portion WCP1. For example, the first light conversion portion WCP1 may convert blue light provided from the light emitting element OL into green light, and the first color filter CF1 may transmit green light provided from the first light conversion portion WCP1. The first color filter CF1 may absorb the first light and the third light incident toward the first color filter CFL. Therefore, it is possible to prevent the color purity from degrading in the first light emitting region PXA1 by absorbing the part of the first light that is not converted by the first light conversion portion WCP1 and is incident on the first color filter CF1.

The second color filter CF2 may be disposed on the second light conversion portion WCP2 to transmit the third light provided from the second light conversion portion WCP2. For example, the second light conversion unit WCP2 may convert blue light provided from the light emitting element OL into red light, and the second color filter CF2 may transmit red light provided from the second light conversion portion WCP2. The second color filter CF2 may absorb the first light and the second light incident toward the second color filter CF2. Therefore, it is possible to prevent the color purity from degrading in the second light emitting region PXA2 by absorbing the part of the first light that is not converted by the second light conversion portion WCP2 and is incident on the second color filter CF2.

The third color filter CF3 may be disposed on the transmission portion WCP3 to transmit the first light passing through the transmission portion WCP3. For example, the transmission portion WCP3 may transmit blue light provided from the light emitting element OL, and the third color filter CF3 may transmit blue light which has passed through the transmission portion WCP3.

External light may be incident on the display panel DP from outside of the display module DM. This external light may include red light, green light, and blue light. If the display module DM does not include the color filter layer CFL, the external light incident on the display panel DP may be reflected by conductive patterns (e.g., signal lines, electrodes, etc.) inside the display panel DP to be provided to a user, and the user may visually recognize the reflected light.

The first, second, and third color filters CF1, CF2, and CF3 may prevent the reflection of external light. The first color filter CF1 transmitting the second light may absorb light corresponding to the wavelength range of each of the first light and the third light in the external light. For example, the first color filter CF1 may be a green color filter, and may absorb light corresponding to red light and blue light in the external light to filter the red light and the blue light into green light. In the same manner, the second color filter CF2 may be a red color filter, and may absorb light corresponding to green light and blue light in the external light to filter the green light and the blue light into red light. The third color filter CF3 may be a blue color filter, and may absorb light corresponding to red light and green light in the external light to filter the red light and the green light into blue light.

The first, second, and third color filters CF1, CF2, and CF3 of an embodiment may overlap each other in the non-light emitting region NPXA along the third direction DR3. The first to third color filters CF1, CF2, and CF3 overlapping each other may block light passing through the non-light emitting region NPXA to prevent color mixing. FIG. 6 exemplarily illustrates the first to third color filters CF1, CF2, and CF3 overlapping each other in the non-light emitting region NPXA, but the embodiment is not limited thereto, and the first to third color filters CF1, CF2, and CF3 may be spaced apart from each other with the non-light emitting region NPXA interposed between them.

In an embodiment, the color filter layer CFL may further include a partition wall surrounding the first, second, and third color filters CF1, CF2, and CF3 and setting boundaries between the first, second, and third color filters CF1, CF2, and CF3. The partition wall of the color filter layer CFL may include a material having a predetermined color, and for example, the partition wall may include a black pigment or a black dye. The partition wall of the color filter layer CFL may absorb light to prevent color mixing.

In the process of manufacturing the light control member LCM according to an embodiment, the light control member LCM may be formed by sequentially stacking the color filter layer CFL, the low refractive layer LR, the first capping layer CP1, the light conversion layer LCL, and the second capping layer CP2 on the rear surface of the second substrate SUB2 in the third direction DR3. Thereafter, on the light conversion layer LCL of the manufactured light control member LCM, a filling member FL may be applied.

On the light control member LCM on which the filling member FL is applied, the display panel DP may be provided such that the filling member FL and the encapsulation layer TFE face each other. Thereafter, the light control member LCM and the display panel DP may be bonded together with the filling member FL interposed therebetween, and a space between the light control member LCM and the display panel DP in the display region DA may be filled by the filling member FL. After the bonding is completed, the display module DM may be provided upside down such that the light providing direction of the light emitting element OL faces upward.

The display module DM according to an embodiment may further include a column spacer CS disposed between the display panel DP and the light control member LCM. As illustrated in FIG. 6, the column spacer CS may be provided in plurality, and each of the column spacers CS may be spaced apart from each other and disposed corresponding to the non-light emitting region NPXA so as not to degrade the light emitting efficiency of the display panel DP. The column spacers CS may overlap the bank portion BK in plan view.

The column spacers CS may be covered by the filling member FL in the display region DA. That is, the column spacers CS may be surrounded by the filling member FL in the display region DA. In plan view, separation spaces between the column spacers CS may be filled by the filling member FL.

In the process of bonding the display panel DP and the light control member LCM, the column spacers CS may support the display panel DP and the light control member LCM such that the display panel DP and the light control member LCM may bonded to each other flat, without caving.

The column spacer CS may include an insulation material. The column spacer CS of an embodiment may include an organic material. In another embodiment, the column spacer CS may further include a black material, and the column spacer CS may prevent, together with the bank portion BK, the color mixing of light. However, the embodiment of the column spacer CS is not necessarily limited thereto.

FIG. 6 exemplarily illustrates the display module DM including the column spacer CS, but the embodiment of the inventive concept is not limited thereto, and the column spacer CS may be omitted.

Figure 7A:
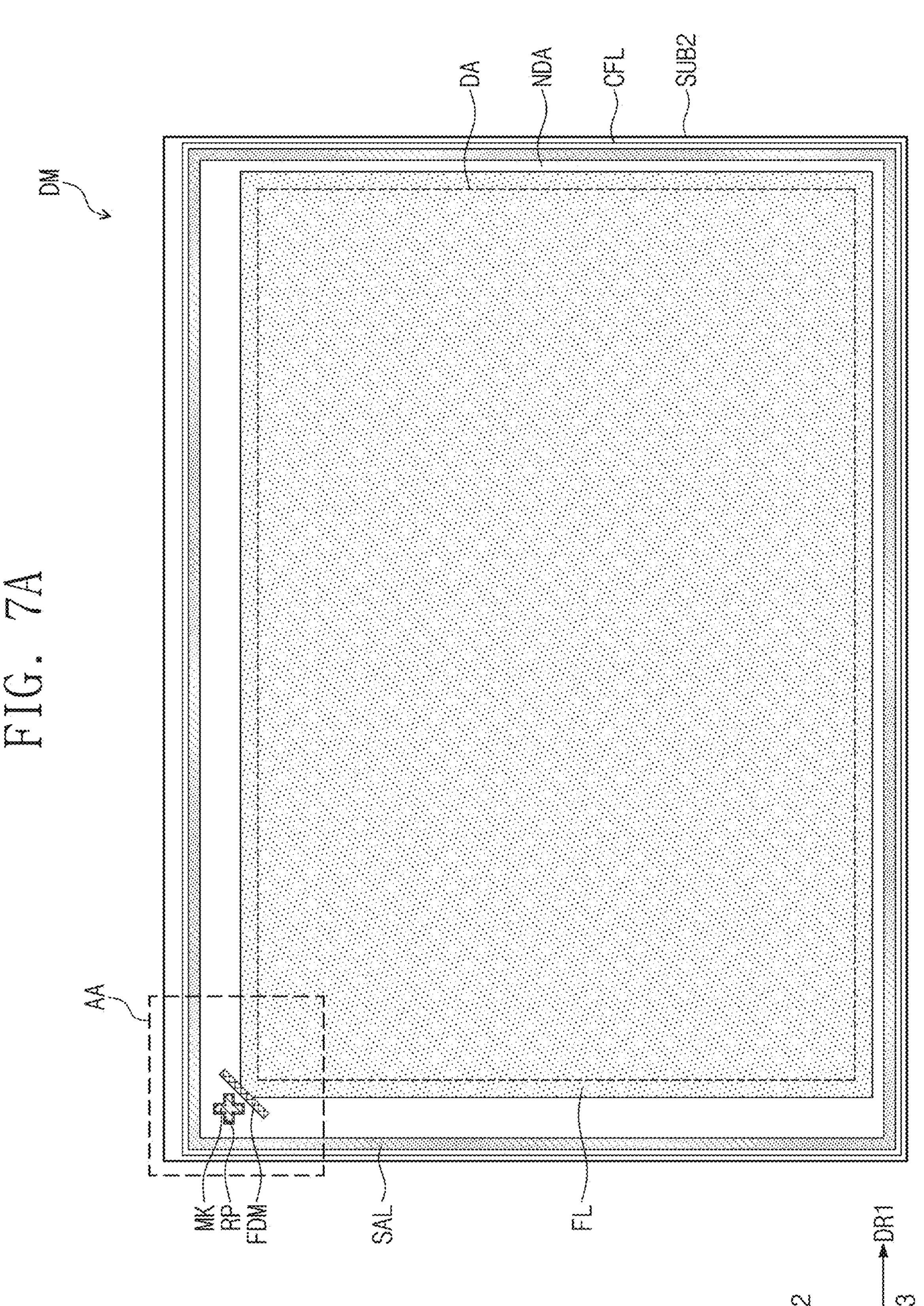
FIG. 7A is a plan view of some components of a display module according to an embodiment of the inventive concept.
Figure 7B:
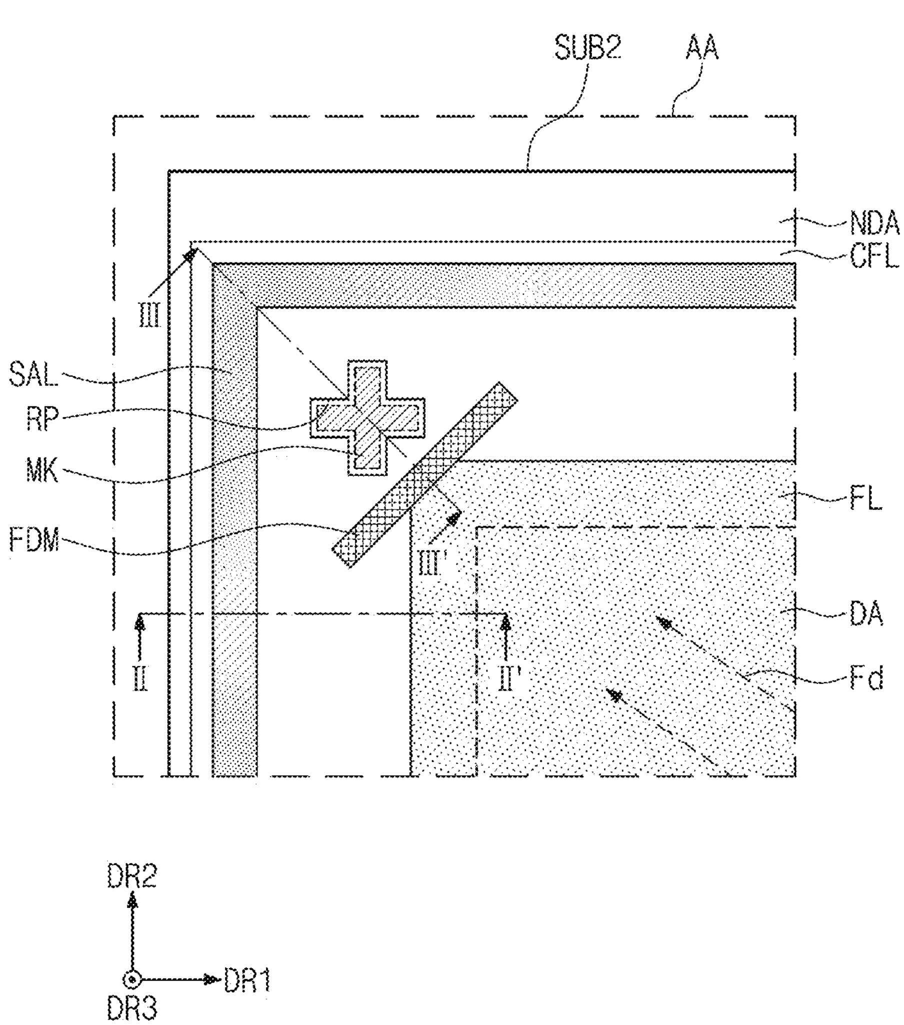
FIG. 7B and FIG. 7C are enlarged plan views of a display module according to an embodiment of the inventive concept corresponding to a region (AA) illustrated in FIG. 7A.
Figure 7C:
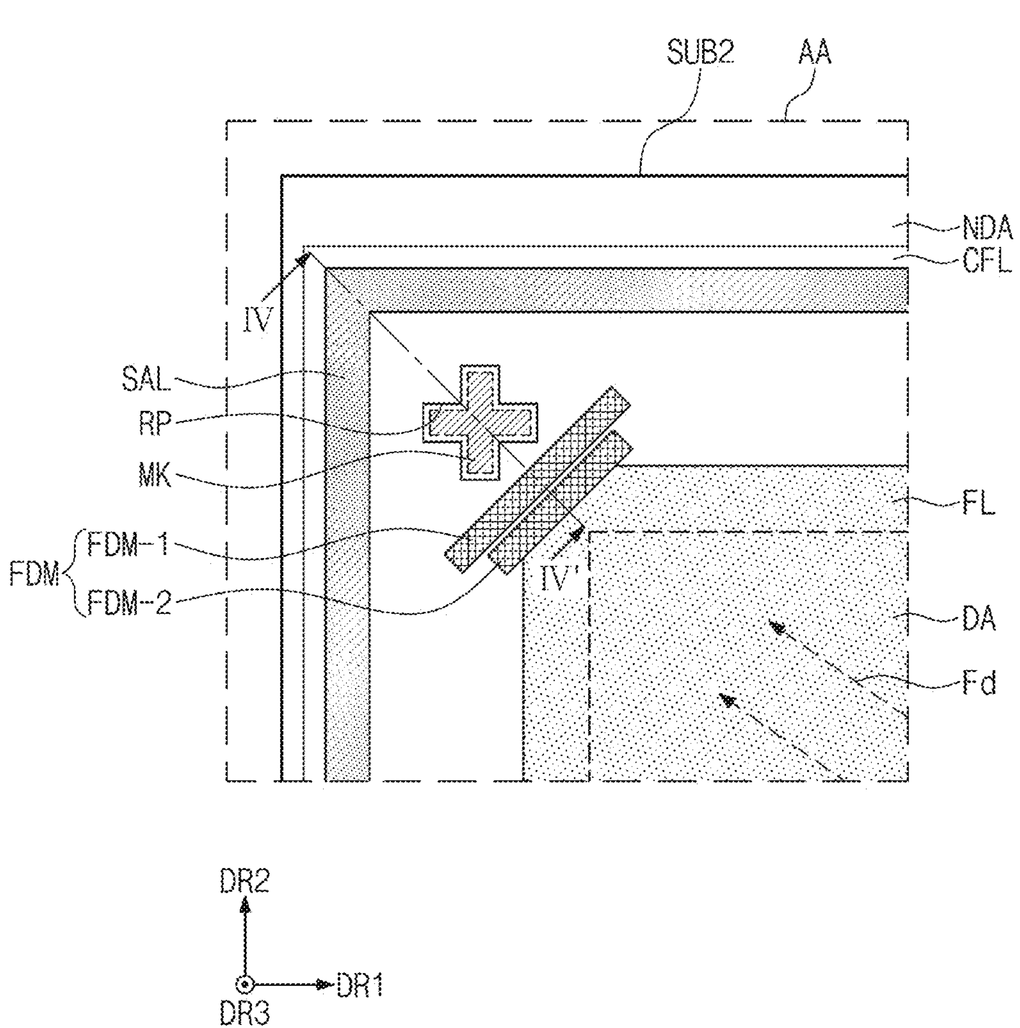
Figure 8A:
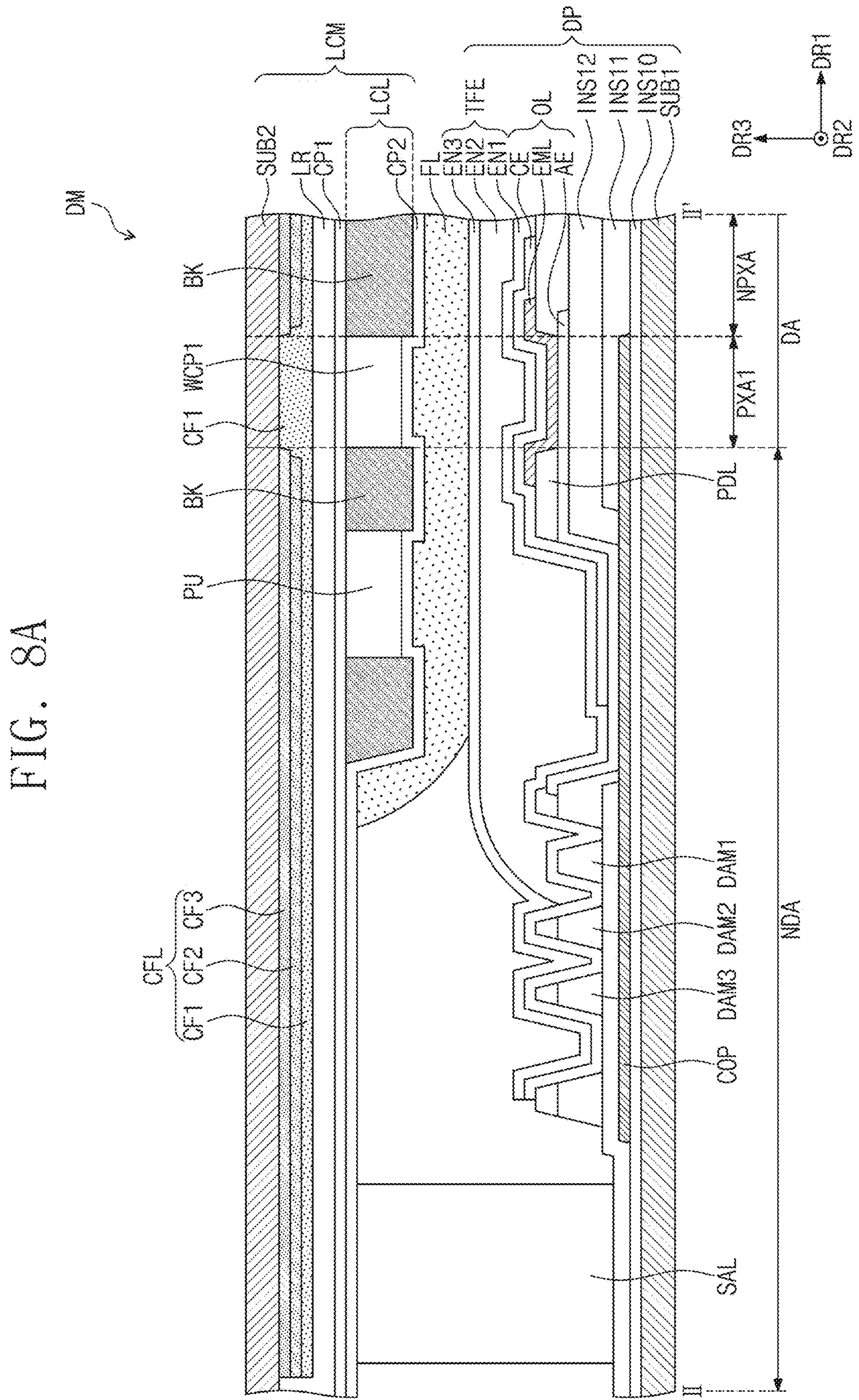
FIG. 8A is a cross-sectional view of a display module according to an embodiment of the inventive concept corresponding to line II-II' illustrated in FIG. 7B.
Figure 8B:
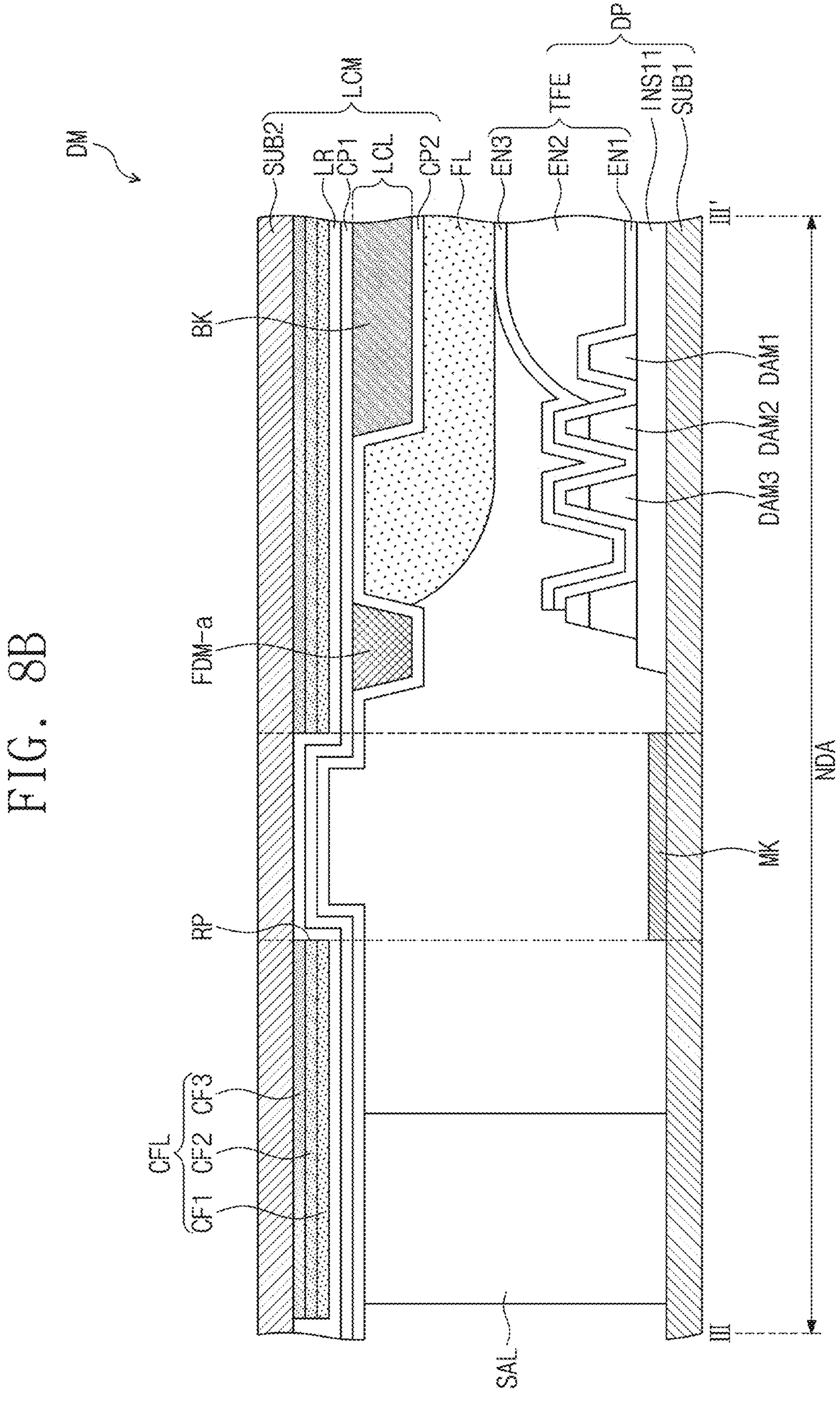
FIG. 8B is a cross-sectional view of a display module according to an embodiment of the inventive concept corresponding to line III-III' illustrated in FIG. 7B.
Figure 8C:
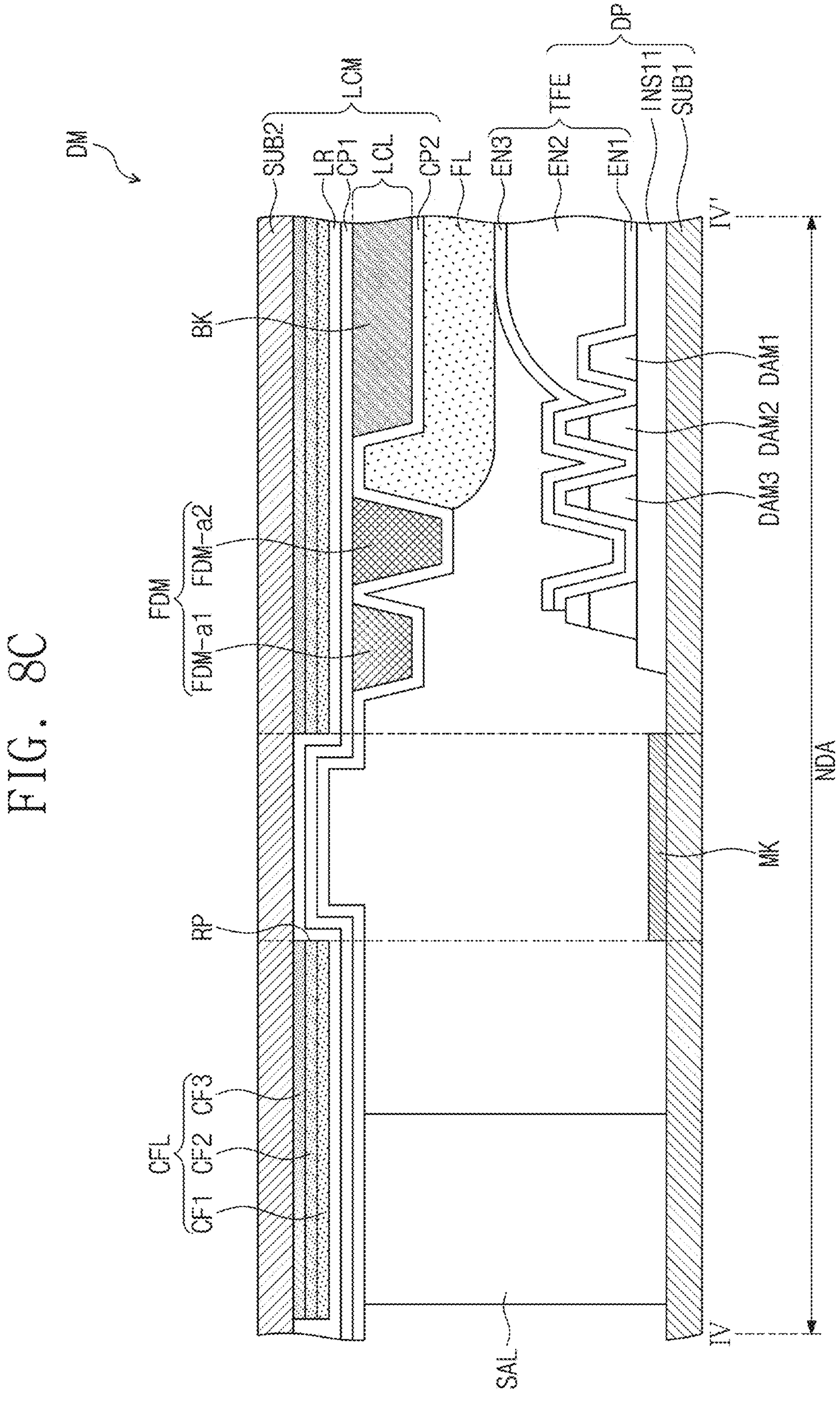
FIG. 8C is a cross-sectional view of a display module according to an embodiment of the inventive concept corresponding to line IV-IV' illustrated in FIG. 7C.
Figures 9A, 9B:
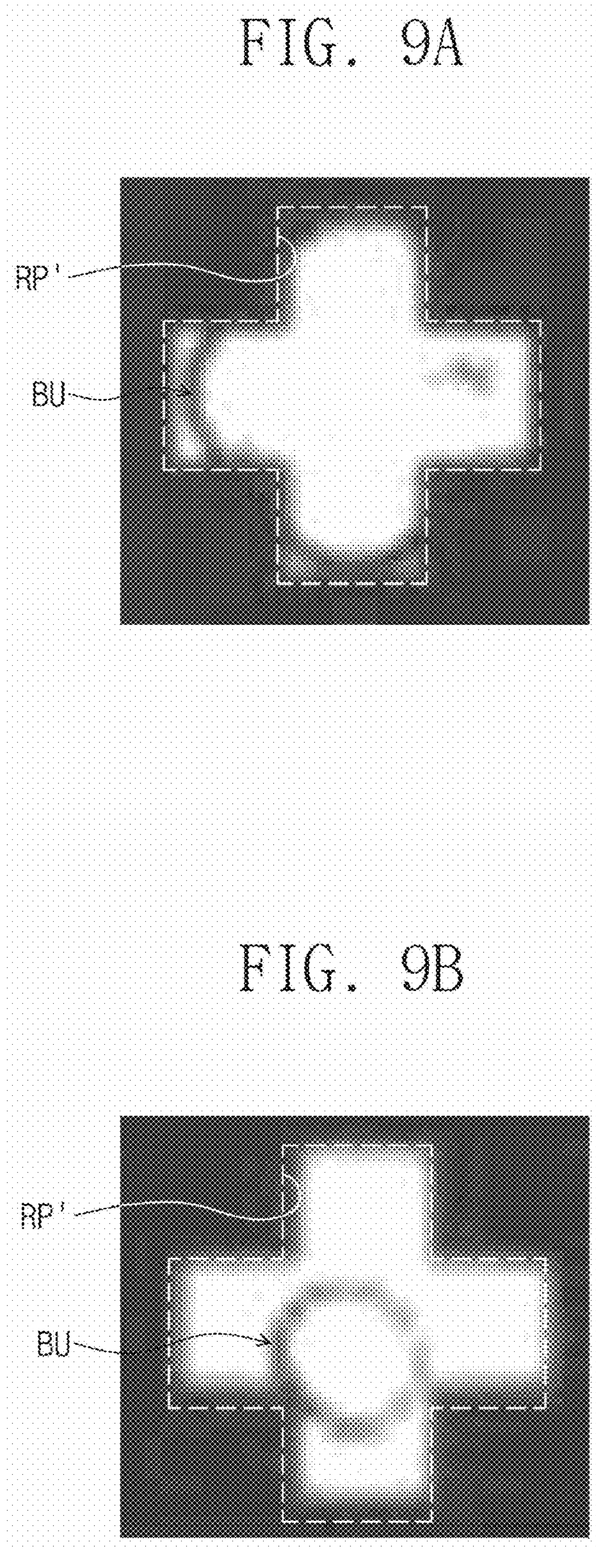
FIG. 9A, FIG. 9B, and FIG. 9C are captured images of a penetration portion according to a comparative embodiment.
Figure 9C:
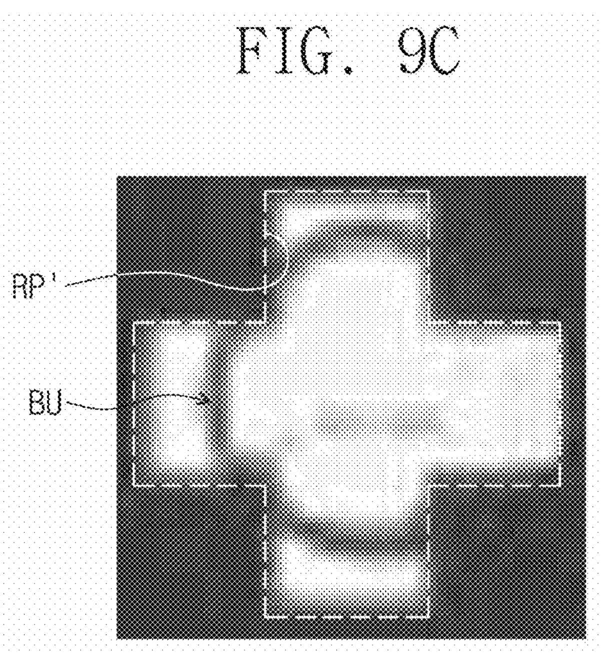

FIG. 7A is a plan view illustrating some components of a display module DM according to an embodiment of the inventive concept. FIG. 7B and FIG. 7C are each an enlarged plan view illustrating a display module DM according to an embodiment corresponding to a region AA of FIG. 7A. FIG. 8A is a cross-sectional view of a display module DM corresponding to line II-II' of FIG. 7B. FIG. 8B is a cross-sectional view of a display module DM corresponding to line III-III' of FIG. 7B. FIG. 8C is a cross-sectional view of a display module DM corresponding to line IV-IV' of FIG. 7C. FIG. 9A, FIG. 9B, and FIG. 9C are captured images of comparative embodiments of the inventive concept.

For convenience of description, FIG. 7A to FIG. 7C schematically illustrate some components disposed on the rear surface of the second substrate SUB2 among the components of the display module DM. The description of each component illustrated in FIG. 7A to FIG. 7C may be the same as described above, and redundant descriptions of components will be omitted.

Referring to FIG. 7A, the sealing member SAL may be disposed to surround the display region DA on the peripheral region NDA. The sealing member SAL may be disposed along the edge of the second substrate SUB2 on the back surface of the second substrate SUB2. In an embodiment, the sealing member SAL may be disposed on the lower surface of the color filter layer CFL.

A cross-section of the display module DM corresponding to the peripheral region NDA in which the sealing member SAL is disposed and of the display region DA adjacent to the peripheral region NDA will be described later in reference to FIG. 8A. FIG. 8A exemplarily illustrates the light emitting element OL disposed adjacent to the peripheral region NDA and corresponding to the first light emitting region PXA1, the first light conversion portion WCP1, and the first color filter CF1.

Referring to FIG. 8A, the first insulation layer INS10 and the second insulation layer INS11 disposed on the upper surface of the first substrate SUB1 may be extended from the display region DA toward the peripheral region NDA. Accordingly, the sealing member SAL may be disposed on the second insulation layer INS11. However, the embodiment is not necessarily limited thereto, and may vary depending on the placement of an insulation layer of the display panel DP. For example, the sealing member SAL may be disposed on the first insulation layer INS10, or may come into contact with the first substrate SUB1.

A conductive pattern COP among the conductive patterns constituting the display panel DP may extend across the display region DA and the peripheral region NDA. The conductive pattern COP of FIG. 8A may be electrically connected to elements included in the circuit layer DP-CL. The second insulation layer INS11 is disposed on less than all the conductive pattern COP in the peripheral region NDA.

The first electrode AE of the light emitting element OL disposed adjacent to the peripheral region NDA may extend into the peripheral region NDA. The first electrode AE may be connected to a portion of the conductive pattern COP, such as the portion that is not covered by the second and third insulation layer INS11 and INS12. The second electrode CE of the light emitting element OL disposed adjacent to the peripheral region NDA may extend into the peripheral region NDA. The second electrode CE may be disposed on the first electrode AE connected to the conductive pattern COP, and be connected to the first electrode AE.

The display panel DP may include a plurality of dams DAM1, DAM2, and DAM3 disposed on the peripheral region NDA. The dams DAM1, DAM2, and DAM3 may prevent the encapsulation layer TFE of the display panel DP from extending to the outside of the peripheral region NDA.

Accordingly, the encapsulation layer TFE may be spaced apart from the sealing member SAL in plan view.

In an embodiment, the dams DAM1, DAM2, and DAM3 may be disposed on the second insulation layer INS11. The dams DAM1, DAM2, and DAM3 may be spaced apart from each other along one direction. The dams DAM1, DAM2, and DAM3 may include a first dam DAM1, a second dam DAM2, and a third dam DAM3. Among the dams DAM1, DAM2, and DAM3, the first dam DAM1 may be disposed closest to the display region DA, and the third dam DAM3 may be disposed farthest from the display region DA. However, the number of the dams DAM1, DAM2, and DAM3 is not limited to the illustrated embodiment, and may be larger or smaller.

At least some of the dams DAM1, DAM2, and DAM3 may be different stacking structures. For example, the first dam DAM1 includes the same material as that of the third insulation layer INS12, and may include an insulation layer corresponding to the stacking structure of the third insulation layer INS12. The second dam DAM2 and the third dam DAM3 may include insulation layers corresponding to the stacking structure of the third insulation layer INS12 and the pixel definition film PDL disposed on the third insulation layer INS12.

At least some of the dams DAM1, DAM2, and DAM3 may be different heights. For example, the height of the first dam DA1 may be less than the height of the second dam DAM2 and the height of the third dam DAM3. However, the embodiment of the inventive concept is not limited thereto, and the heights of the dams DAM1, DAM2, and DAM3 may be the same as each other.

The first encapsulation film EN1 of the encapsulation layer TFE may extend from the display region DA to the peripheral region NDA, and be disposed on the dams DAM1, DAM2, and DAM3. The second encapsulation film EN2 of the encapsulation layer TFE may be disposed on the first encapsulation film EN1.

The dams DAM1, DAM2, and DAM3 may partition a region in which the second encapsulation film EN2 including an organic film is formed. In a manufacturing process of the display panel DP, the second encapsulation film EN2 having fluidity may flow toward the peripheral region NDA and be blocked by one of the dams DAM1, DAM2, and DAM3. FIG. 8A exemplarily illustrates the second encapsulation film EN2 whose flow is blocked in a space between the first dam DAM1 and the second dam DAM2.

The third encapsulation film EN3 may be disposed on the second encapsulation film EN2 to cover the second encapsulation film EN2. The third encapsulation film EN3 may extend further into the peripheral region NDA than the second encapsulation film EN2. Referring to FIG. 8A, the third encapsulation film EN3 may be disposed on the second dam DAM2 blocking the second encapsulation film EN2 from flowing to cover the second dam DAM2 and the third dam DAM3. The third encapsulation film EN3 may contact the first encapsulation film EN1 disposed on the second dam DAM2 and the third dam DA3 where the second encapsulation film EN2 is absent. Together with the first encapsulation film EN1, the third encapsulation film EN3 may encapsulate the second encapsulation film EN2. Accordingly, it is possible to prevent moisture or oxygen from penetrating into the second encapsulation film EN2.

However, the cross-section of the display panel DP illustrated in FIG. 8A is exemplary, and the stacking form of the components is not necessarily limited thereto.

The light conversion layer LCL may further include a dummy pattern PU. Not only the bank portion BK is disposed in the display region DA, but also a portion of the bank portion BK may be disposed on the peripheral region NDA. The bank portion BK may have an opening overlapping the peripheral region NDA, and the dummy pattern PU may be disposed in the opening of the bank portion BK overlapping the peripheral region NDA. The dummy pattern PU may be spaced apart from the light emitting element OL in plan view. That is, the dummy pattern PU does not overlap light emitting regions, and accordingly, light may not be emitted through the dummy pattern PU.

The dummy pattern PU may include a base resin and quantum dots. A light conversion portion of an embodiment may be formed in an ink-jet manner, and in order to prevent quantum dots from not being uniformly distributed in the light conversion portion, composition of the light conversion portion may be preliminarily applied to a region not overlapping a light emitting element in the initial stage of an ink-jet step. The dummy pattern PU may correspond to a portion preliminarily formed before forming the light conversion portion overlapping the light emitting element OL. However, in an embodiment, the dummy pattern PU may be omitted.

A portion of the color filter layer CFL may overlap the peripheral region NDA. The portion of the color filter layer CFL overlapping the peripheral region NDA may include the first to third color filters CF1, CF2, and CF3 stacked along the third direction DR3. The first to third color filters CF1, CF2, and CF3 may include a red color filter, a green color filter, and a blue color filter.

The first to third color filters CF1, CF2, and CF3 overlapping each other along a thickness direction may block light from being emitted or entering through the peripheral region NDA The first to third color filters CF1. CF2, and CF3 overlapping each other along a thickness direction may also prevent reflection of external light incident toward the peripheral region NDA The stacking order of the first to third color filters CF1, CF2, and CF3 is not limited to what is illustrated, and may be changed according to the order of forming the first to third color filters CF1, CF2, and CF3 in a manufacturing process of the light control member LCM.

The low refractive layer LR, the first capping layer CP1, and the second capping layer CP2 may be disposed extended from the display region DA to the peripheral region NDA. Accordingly, the sealing member SAL may be disposed on the second capping layer CP2. However, the embodiment of the inventive concept is not necessarily limited thereto.

The sealing member SAL may be disposed between the first substrate SUB1 and the second substrate SUB2. The sealing member SAL may be disposed, in a thickness direction (e.g., the third direction DR3) of the display module DM, between an insulation layer (e.g., the second insulation layer INS11 of FIG. 8A) of the display panel DP extending to the peripheral region NDA and an insulation layer (e.g., the second capping layer CP2 of FIG. 8A) of the light control member LCM.

The filling member FL may flow from the display region DA toward the peripheral region NDA and be cured. By controlling an amount of the filling member FL to be applied, it is possible to form the filling member FL spaced apart from the sealing member SAL in plan view. Through the above, it is possible to prevent the filling member FL from overflowing to the outside of the sealing member SAL.

Referring to FIG. 7B and FIG. 7C, a penetration portion RP may be defined in the color filter layer CFL by absence of color filters CF1, CF2, and CF3. The penetration portion RP may be disposed to align with the alignment pattern MK.

To facilitate understanding, FIG. 7A, FIG. 7B, and FIG. 7C illustrate the alignment pattern MK aligned with the penetration portion RP. Using the penetration portion RP corresponding to the alignment pattern MK, a bonding position between the first substrate SUB1 of the display panel DP and the second substrate SUB2 of the light control member LCM may be accurately aligned, and then the first substrate SUB1 and the second substrate SUB2 may be bonded to each other. After the display panel DP and the light control member LCM are bonded, the alignment pattern MK may be visually recognized through the penetration portion RP, and may be used to recognize the position of the display module DM in the following process of manufacturing a display device.

The penetration portion RP will be described in more detail with reference to the drawing of FIG. 8B. Referring to FIG. 8B, the penetration portion RP may be formed penetrating from a lower surface of the color filter layer CFL to a front surface thereof. The penetration portion RP may be defined in a portion of the color filter layer CFL overlapping the peripheral region NDA. The portion of the color filter layer CFL overlapping the peripheral region NDA may include the first to third color filters CF1. CF2, and CF3 stacked along the third direction DR3, and the penetration portion RP may be formed penetrating the first to third color filters CF1, CF2, and CF3.

The width of the penetration portion RP may be uniform. Penetration portions defined in each of the first to third color filters CF1, CF2, and CF3 may overlap each other to form the penetration portion RP of one body. The widths of the penetration portions respectively defined in the first to third color filters CF1, CF2, and CF3 may substantially be the same as each other, and accordingly, the penetration portion RP may have a shape having a uniform width in a cross-sectional view. However, the embodiment of the inventive concept is not limited thereto, and the width of the penetration portion RP in a cross-sectional view may be different along the third direction DR3. For example, in a cross-sectional view, the width of the penetration portion RP of an embodiment may become smaller as getting closer to the second substrate SUB2, which will be described in more detail with reference to FIG. 13.

The penetration portion RP may overlap the low refractive layer LR, the first capping layer CP1, and the second capping layer CP2 disposed on the lower surface of the color filter layer CFL. Accordingly, the low refractive layer LR, the first capping layer CP1, and the second capping layer CP2 may cover a cross-section of the color filter layer CFL exposed by the penetration portion RP.

The shape of the penetration portion RP may substantially correspond to the shape of the alignment pattern MK. For example, when the alignment pattern MK has a circular or polygonal shape, the penetration portion RP may also have a circular or polygonal shape in correspondence thereto. FIG. 7B and FIG. 7C illustrate the penetration portion RP having a cross shape corresponding to the alignment pattern MK having a cross shape.

The planar area of the penetration portion RP may substantially be the same as the planar area of the alignment pattern MK, or may be larger than the planar area of the alignment pattern MK. Accordingly, the alignment pattern MK overlapping the penetration portion RP may be accurately recognized by a sensing device.

The alignment pattern MK may be disposed on the upper surface of the first substrate SUB1 overlapping the peripheral region NDA. In plan view, the alignment pattern MK may be spaced apart from the light emitting element OL disposed in the display region DA. Accordingly, the penetration portion RP overlapping the alignment pattern MK may also be spaced apart from the light emitting element OL.

The alignment pattern MK may be simultaneously formed in a process of forming one of the conductive patterns of the display panel DP. For example, the alignment pattern MK may be formed on the peripheral region NDA of the first substrate SUB1, in a step of forming the gate electrode Ga (see FIG. 5A) included in the display panel DP. However, the embodiment of the inventive concept is not necessarily limited thereto.

The alignment pattern MK may be disposed spaced apart from the second insulation layer INS11 of the display panel DP and the encapsulation layer TFE which are disposed extended toward the peripheral region NDA. Accordingly, it is possible to minimize factors causing errors in a process in which the sensing device recognizes the alignment pattern MK, and the alignment pattern MK may be accurately recognized through the penetration portion RP.

The penetration portion RP may be disposed inside of the sealing member SAL. In plan view, the penetration portion RP may be disposed on the peripheral region NDA between the display region DA and the sealing member SAL. If the penetration portion RP is disposed outside of the sealing member SAL, the alignment pattern MK overlapping the penetration portion RP may also be disposed outside of the sealing member SAL. The penetration portion RP and the alignment pattern MK formed outside of the sealing member SAL may be cut out during a process of manufacturing the display module DM, and may not serve to indicate the position of the display module DM.

The filling member FL may be applied on the rear surface of the second substrate SUB2 to overlap the display region DA. In the process of bonding the light control member LCM and the display panel DP, the filling member FL may fill an empty space between the display panel DP and the light control member LCM. In this process, the filling member FL may flow from the display region DA toward the peripheral region NDA Through the control of an amount thereof to be applied, the filling member FL may be applied in an internal region surrounded by the sealing member SAL. That is, by controlling the amount of the filling member FL, it is possible to prevent the filling member FL from overflowing to an area on the other side of the sealing member SAL. However, since the penetration portion RP is disposed further inside than the sealing member SAL, some of the filling member FL may contact the penetration portion RP during the application process. FIG. 7B and FIG. 7C exemplarily illustrate a flow direction Fd of the filling member FL entering toward the penetration portion RP.

The display module DM may include a filling member blocking portion FDM. The filling member blocking portion FDM may be disposed on the rear surface of the second substrate SUB2. In plan view, the filling member blocking portion FDM may be disposed in a region between the display region DA and the penetration portion RP. The filling member blocking portion FDM may be disposed between the penetration portion RP and the filling member FL to prevent the filling member FL from entering the penetration portion RP.

The filling member blocking portion FDM may be disposed surrounding at least a portion of an outer region of the penetration portion RP. The filling member blocking portion FDM may have a shape extending in one direction crossing the flow direction Fd of the filling member FL in plan view.

The filling member blocking portion FDM may be provided as a single component as illustrated in FIG. 7B. However, the embodiment of the inventive concept is not limited thereto, and the filling member blocking portion FDM may be provided as a plurality of filling member blocking portions FDM-1 and FDM-2 as illustrated in FIG. 7C. Referring to FIG. 7C, the plurality of filling member blocking portions FDM-1 and FDM-2 may include a first filling member blocking portion FDM-1 and a second filling member blocking portion FDM-2 arranged along one direction.

Each of the first filling member blocking portion FDM-1 and the second filling member blocking portion FDM-2 may be disposed between the penetration portion RP and the filling member FL in plan view. The first filling member blocking portion FDM-1 may be disposed more adjacent to the penetration portion RP than the second filling member blocking portion FDM-2 in plan view. However, the embodiment is not limited thereto, and one of the first filling member blocking portion FDM-1 and the second filling member blocking portion FDM-2 may be disposed between the sealing member SAL and the penetration portion RP in plan view.

The first filling member blocking portion FDM-1 and the second filling member blocking portion FDM-2 may have the same shape as each other, although not necessarily the same size. As illustrated in FIG. 7C, each of the first filling member blocking portion FDM-1 and the second filling member blocking portion FDM-2 may have a rectangular shape extending in one direction crossing the flow direction Fd. However, the embodiment of the inventive concept is not limited thereto, and the first filling member blocking portion FDM-1 and the second filling member blocking portion FDM-2 may have different shapes from each other.

The first filling member blocking portion FDM-1 and the second filling member blocking portion FDM-2 may have different sizes from each other. Here, the size of a filling member blocking portion may include the length of the filling member blocking portion defined in an extension direction, the width of the filling member blocking portion defined in a direction crossing the extension direction, the thickness of the filling member blocking portion defined in a thickness direction, and the like. However, the embodiment of the inventive concept is not limited thereto, and in an embodiment, the plurality of filling member blocking portions FDM-1 and FDM-2 may have the same size as each other.

FIG. 7C illustrates the first and second filling member blocking portions FDM-1 and FDM-2 having different lengths defined in an extension direction of the filling member blocking portion FDM. The length of the first filling member blocking portion FDM-1 may be greater than the length of the second filling member blocking portion FDM-2. However, the embodiment of the inventive concept is not limited thereto, and the length of the first filling member blocking portion FDM-1 disposed more adjacent to the penetration portion RP may be less than the length of the second filling member blocking portion FDM-2 in some embodiments.

The number, shape, size, and the like of the filling member blocking portion FDM are not limited to any one embodiment as long as it is possible to prevent the filling member FL from entering or contacting the penetration portion RP.

The filling member blocking portion FDM may be protruding or recessed from the lower surface of the color filter layer CFL depending on an embodiment. For example, the filling member blocking portion FDM of an embodiment may include a blocking dam disposed on the lower surface of the color filter layer CFL. However, the inventive concept is not limited thereto, and the filling member blocking portion FDM of an embodiment may include a hole formed penetrating the color filter layer CFL.

FIG. 8B and FIG. 8C illustrate the filling member blocking portion FDM of an embodiment protruding from the lower surface of the color filter layer CFL.

Referring to FIG. 8B, the filling member blocking portion FDM may include a blocking dam FDM-a disposed on the lower surface of the color filter layer CFL. The blocking dam FDM-a may protrude toward the first substrate SUB1 from the lower surface of the color filter layer CFL. The blocking dam FDM-a may prevent the filling member FL from entering the penetration portion RP.

The blocking dam FDM-a may include the same material as that of the bank portion BK. The blocking dam FDM-a and the bank portion BK are disposed on the same layer, and may simultaneously be formed with the bank portion BK. However, the embodiment of the inventive concept is not limited thereto, and the blocking dam FDM-a may include the same material as that of the column spacer CS (see FIG. 6) described above. The blocking dam FDM-a is simultaneously formed in a step of forming the column spacer CS (see FIG. 6), and may be disposed on the same layer as that of the column spacer CS (see FIG. 6). Therefore, the blocking dam FDM-a may be formed in the display module DM without the addition of a separate process.

A portion of the blocking dam FDM-a may overlap the filling member FL. When the filling member FL flows up to a region in which the blocking dam FDM-a is disposed and is cured, an end of the filling member FL may overlap the portion of the blocking dam FDM-a. However, the embodiment of the inventive concept is not limited thereto, and the filling member FL may not flow up to the region in which the blocking dam FDM-a is disposed, and in this case, the filling member FL may be spaced apart from the blocking dam FDM-a in plan view.

According to an embodiment, at least one insulation layer may be disposed between the blocking dam FDM-a and the color filter layer CFL. For example, the low refractive layer LR and the first capping layer CP1 may be disposed on the lower surface of the color filter layer CFL, and the blocking dam FDM-a may be disposed on the first capping layer CP1. However, the embodiment of the inventive concept is not limited thereto, and the blocking dam FDM-a of an embodiment may be in contact with the lower surface of the color filter layer CFL.

The blocking dam FDM-a may be disposed between an end of the light conversion layer LCL and the penetration portion RP in plan view. For example, the blocking dam FDM-a may be disposed between the outermost portion of the bank portion BK included in the light conversion layer LCL and the penetration portion RP. The blocking dam FDM-a may be spaced apart from the light conversion layer LCL in plan view. However, the embodiment is not limited thereto.

The blocking dam FDM-a may be spaced apart from the encapsulation layer TFE of the display panel DP. In a thickness direction (e.g., the third direction DR3), the blocking dam FDM-a may be spaced apart from the dams DAM1, DAM2, and DAM3 of the display panel DP which control the flow of the encapsulation layer TFE.

Referring to FIG. 8C, the filling member blocking portion FDM may include a plurality of blocking dams FDM-a1 and FDM-a2. The plurality of blocking dams FDM-a1 and FDM-a2 may include a first blocking dam FDM-a1 and a second blocking dam FDM-a2 arranged along one direction.

Each of the first blocking dam FDM-a1 and the second blocking dam FDM-a2 may be disposed between the filling member FL and the penetration portion RP in plan view. The first blocking dam FDM-a1 may be disposed between the penetration portion RP and the second blocking dam FDM-a2. However, the embodiment of the inventive concept is not limited thereto. For example, one of the first blocking dam FDM-a1 and the second blocking dam FDM-a2 may be disposed between the penetration portion RP and the sealing member SAL.

The first blocking dam FDM-a1 and the second blocking dam FDM-a2 may have different heights from each other. For example, among the plurality of blocking dams FDM-a1 and FDM-a2, the height of the second blocking dam FDM-a2, which is disposed adjacent to the filling member FL, may be greater than the height of the first blocking dam FDM-a1. A portion of the second blocking dam FDM-a2 overlaps the filling member FL, and may control the flow of the filling member FL, and the first blocking dam FDM-a1 may be spaced apart from the filling member FL. However, the embodiment of the inventive concept is not limited thereto, and the height of the second blocking dam FDM-a2 may be the same as or less than the height of the first blocking dam FDM-a1.

Each of the first blocking dam FDM-a1 and the second blocking dam FDM-a2 may be formed through the same process. The first blocking dam FDM-a1 and the second blocking dam FDM-a2 may include the same material as each other.

FIG. 8C exemplarily illustrates a plurality of two blocking dams FDM-a1 and FDM-a2 having different dimensions from each other. However, the number, size, and the like of the plurality of blocking dams are not limited to any one embodiment as long as it is possible to prevent the filling member FL from entering or contacting the penetration portion RP.

FIG. 9A to FIG. 9C are captured images of a penetration portion RP' of comparative embodiments not including a filling member blocking portion. In a comparative embodiment that does not have a filling member blocking portion, the filling member FL may enter the penetration portion RP'. When the filling member FL enters into the penetration portion RP', bubbles of the filling member FL may be generated in the penetration portion RP'.

In a manufacturing process of a display device, a sensing device may sense the alignment pattern MK overlapping the penetration portion RP' to align the position of the display panel DP, and when the filling member FL enters into the penetration portion RP', the sensing device may not recognize the alignment pattern MK. For example, referring to FIG. 9A to FIG. 9C, in an image recognized by the sensing device, a bubble BU of the filling member FL formed in the penetration portion RP' may be shown in a dark circular ring form. When a bubble BU is present, the sensing device may not properly recognize the penetration portion RP' and the alignment pattern MK. In addition, as illustrated in FIG. 9A to FIG. 9C, the shape and position of the bubble BU formed in the penetration portion RP' may be irregular. Therefore, there is a problem in that it is not possible to solve the problem of process failure only by controlling the software of the sensing device.

The display module DM of the inventive concept may prevent the filling member FL from entering the penetration portion RP and forming a bubble BU. More specifically, the filling member blocking portion FDM blocks the filling member FL from entering the penetration portion RP and thus, may prevent an error in which a sensing device does not recognize the penetration portion RP and the alignment pattern MK. Accordingly, errors occurring in the manufacturing process of a display device may be decreased, and the reliability of the manufacturing process of the display device may be improved. In addition, an embodiment of the inventive concept prevents the loss of the display device caused by process errors in the manufacturing process, and thus, may improve the yield of the display device.

Figure 10A:
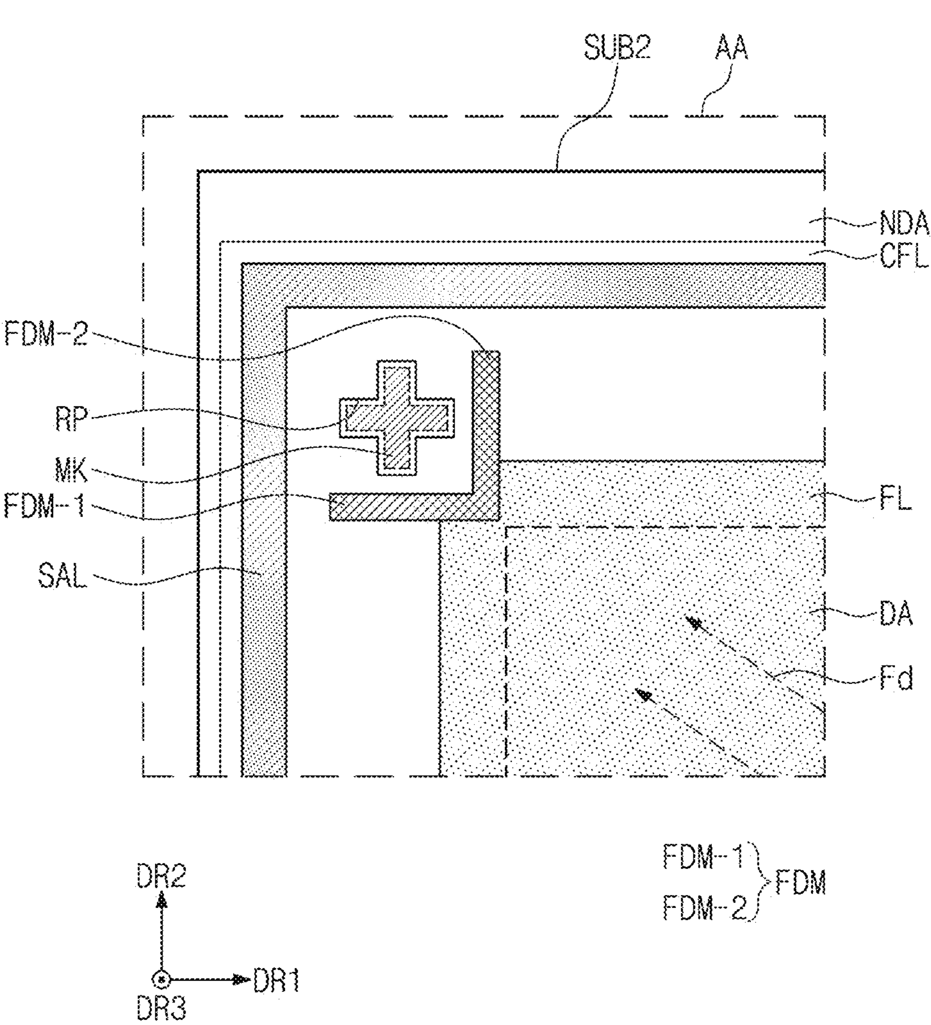
FIG. 10A, FIG. 10B, and FIG. 10C are enlarged plan views of a display module according to an embodiment of the inventive concept corresponding to the region (AA) of FIG. 7A.
Figure 10B:
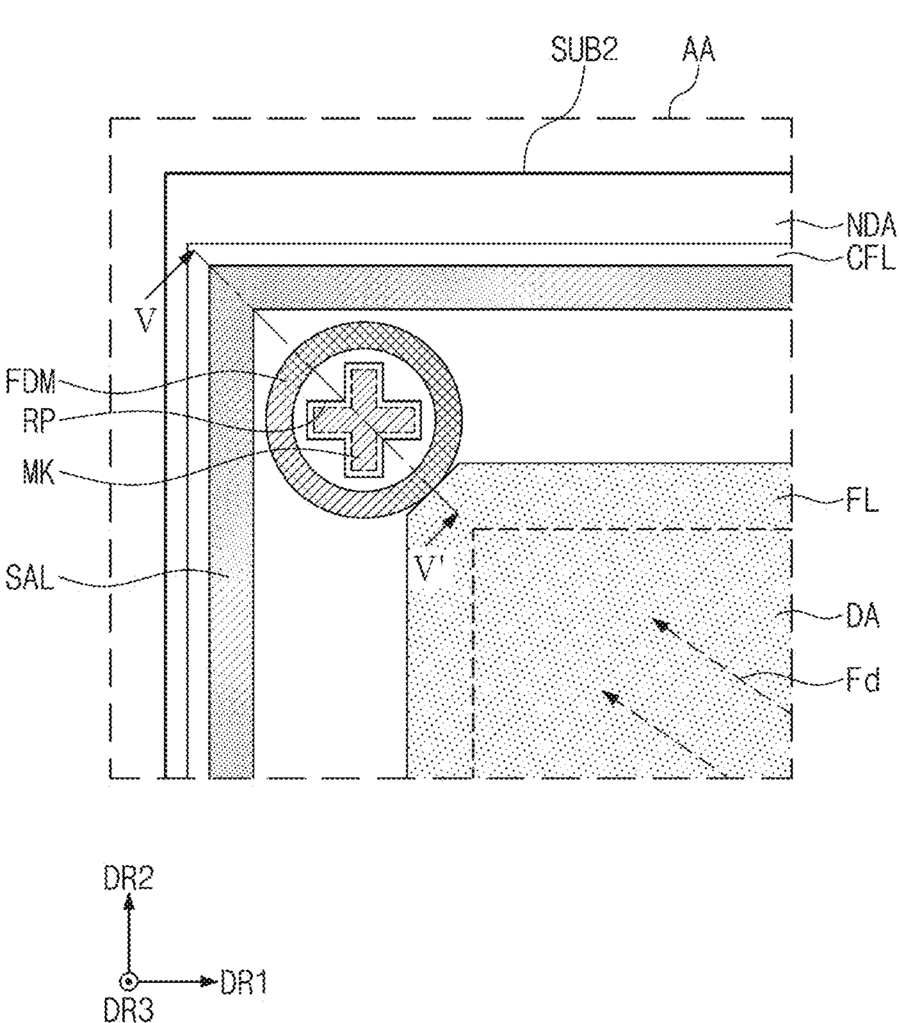
Figure 10C:
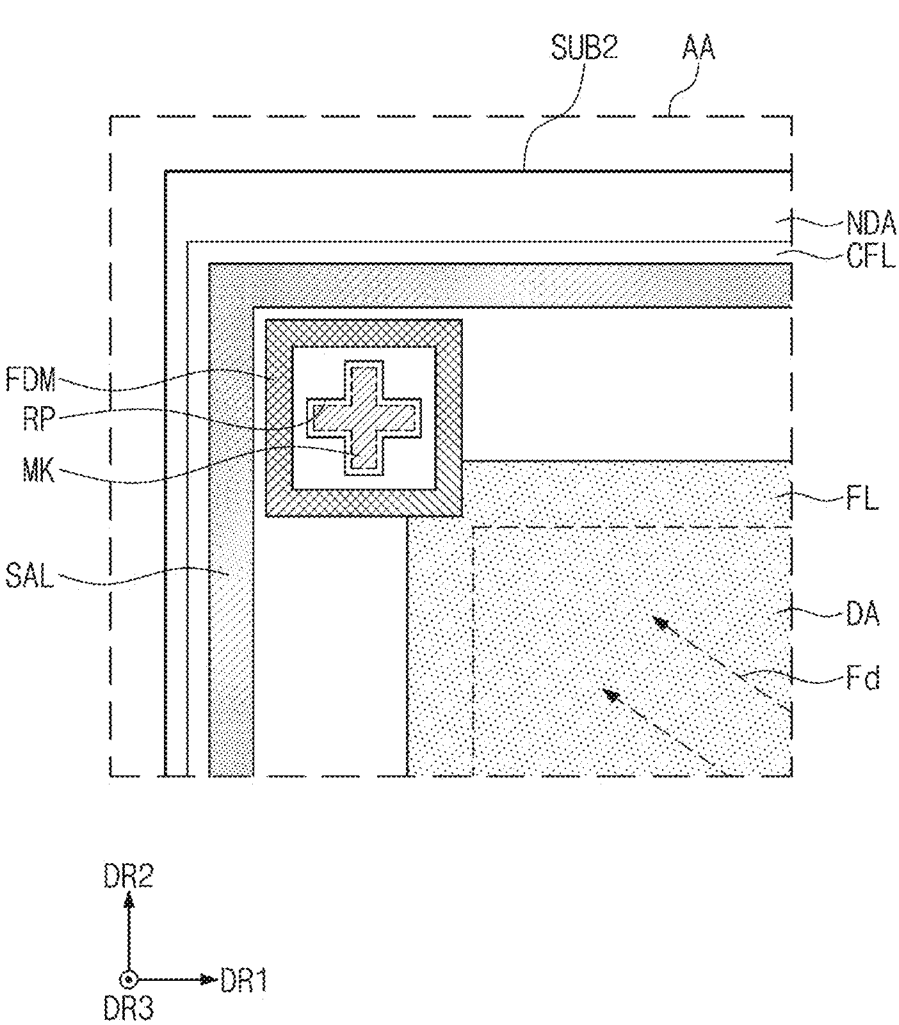

FIG. 10A to FIG. 10C are enlarged plan views of display modules DM according to an embodiment corresponding to the region AA of FIG. 7A. Embodiments illustrated in FIG. 10A to FIG. 10C include substantially the same components as those of the embodiments illustrated in FIG. 7B, and there are some differences in the shape of the filling member blocking portion FDM in plan view. Thereafter, differences between embodiments will be mainly described.

Referring to FIG. 10A, the filling member blocking portion FDM may include the first portion FDM-1 and the second portion FDM-2 bent from the first portion FDM-1. An extension direction of the first portion FDM-1 may be different from an extension direction of the second portion FDM-2. For example, the first portion FDM-1 may be a portion extending along the first direction DR1, and the second portion FDM-2 may be a portion extended along the second direction DR2. The extension direction of the first portion FDM-1 and the extension direction of the second portion FDM-2 may each be a direction crossing the flow direction Fd of the filling member FL. The first portion FDM-1 and the second portion FDM-2 of the filling member blocking portion FDM may be formed as one body.

Referring to FIG. 10B and FIG. 10C, the filling member blocking portion FDM may completely surround the outer region of the penetration portion RP. The filling member blocking portion FDM may have a closed line shape surrounding the penetration portion RP. Referring to FIG. 10B, the filling member blocking portion FDM may have a circular closed line shape. However, the inventive concept is not limited thereto, and referring to FIG. 10C, the filling member blocking portion FDM may have a quadrangular closed line shape. The shape of the filling member blocking portion FDM is not limited to the illustrated embodiments, and may have various shapes such as an elliptical ring, a polygonal ring, and the like. As the filling member blocking portion FDM is disposed completely surrounding the penetration portion RP, it is possible to effectively prevent the entering of the filling member FL which may flow toward various directions.

However, the shape of the filling member blocking portion FDM is not limited to any one embodiment as long as it is possible to block the filling member FL entering toward the penetration portion RP.

Figure 11:
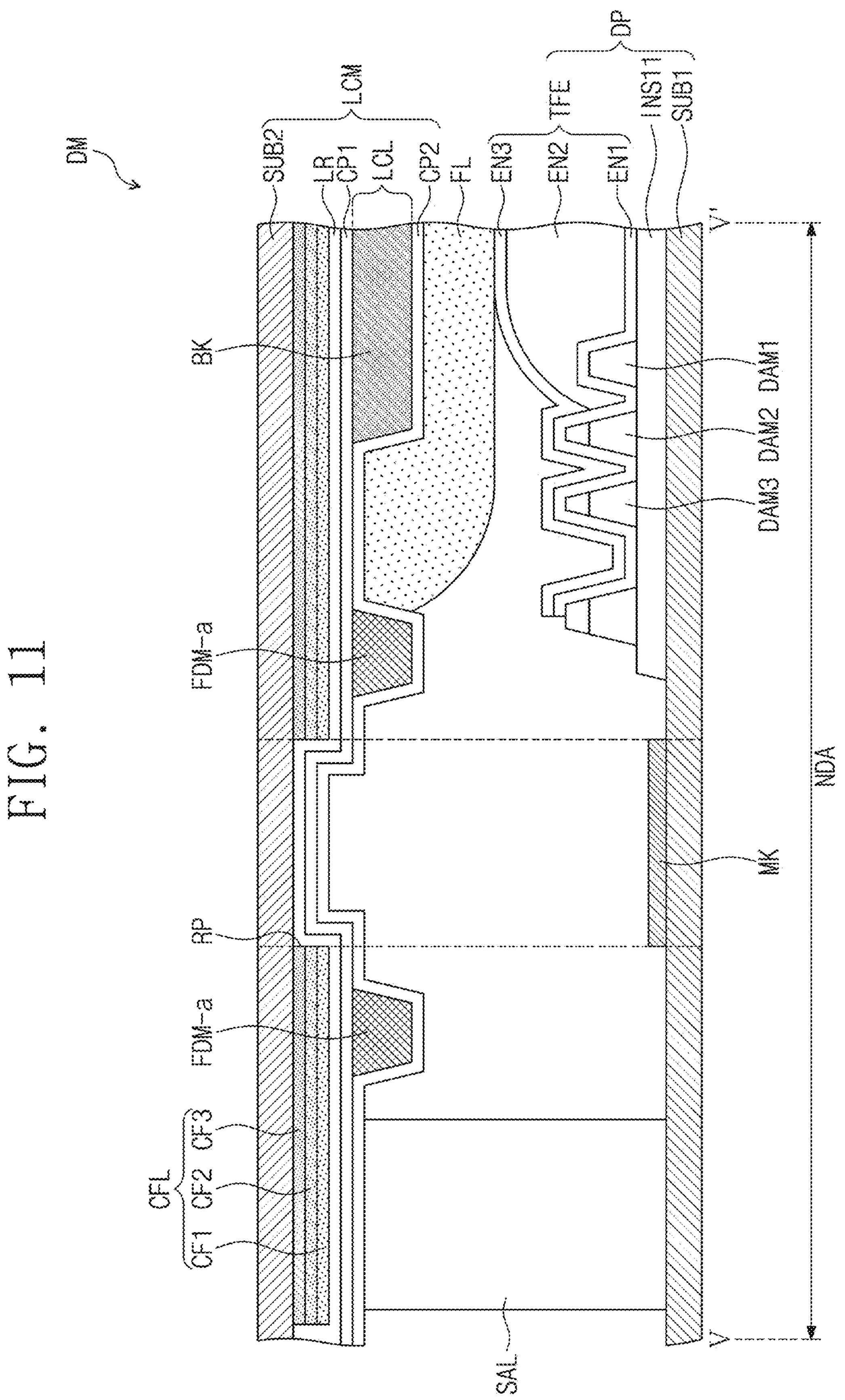
FIG. 11 is a cross-sectional view of a display module according to an embodiment of the inventive concept corresponding to line V-V' illustrated in FIG. 10B.

FIG. 11 is a cross-sectional view of a display module DM according to an embodiment of the inventive concept corresponding to line V-V' of FIG. 10B. The embodiment of FIG. 11 includes substantially the same components as those of the embodiment illustrated in FIG. 8B, and there are some differences in the placement shape of the blocking dam FDM-a.

In an embodiment, the blocking dam FDM-a may be disposed surrounding the penetration portion RP in plan view as illustrated in FIG. 10B or FIG. 10C. Therefore, in a cross-sectional view, one portion of the blocking dam FDM-a may be disposed between the filling member FL and the penetration portion RP, and the other portion of the blocking dam FDM-a may be disposed between the sealing member SAL and the penetration portion RP. As the blocking dam FDM-a completely surrounds the penetration portion RP, it is possible to effectively block the filling member FL from entering the penetration portion RP, and at the same time, it is possible to prevent the filling member FL from overflowing toward the sealing member SAL.

Figure 12A:
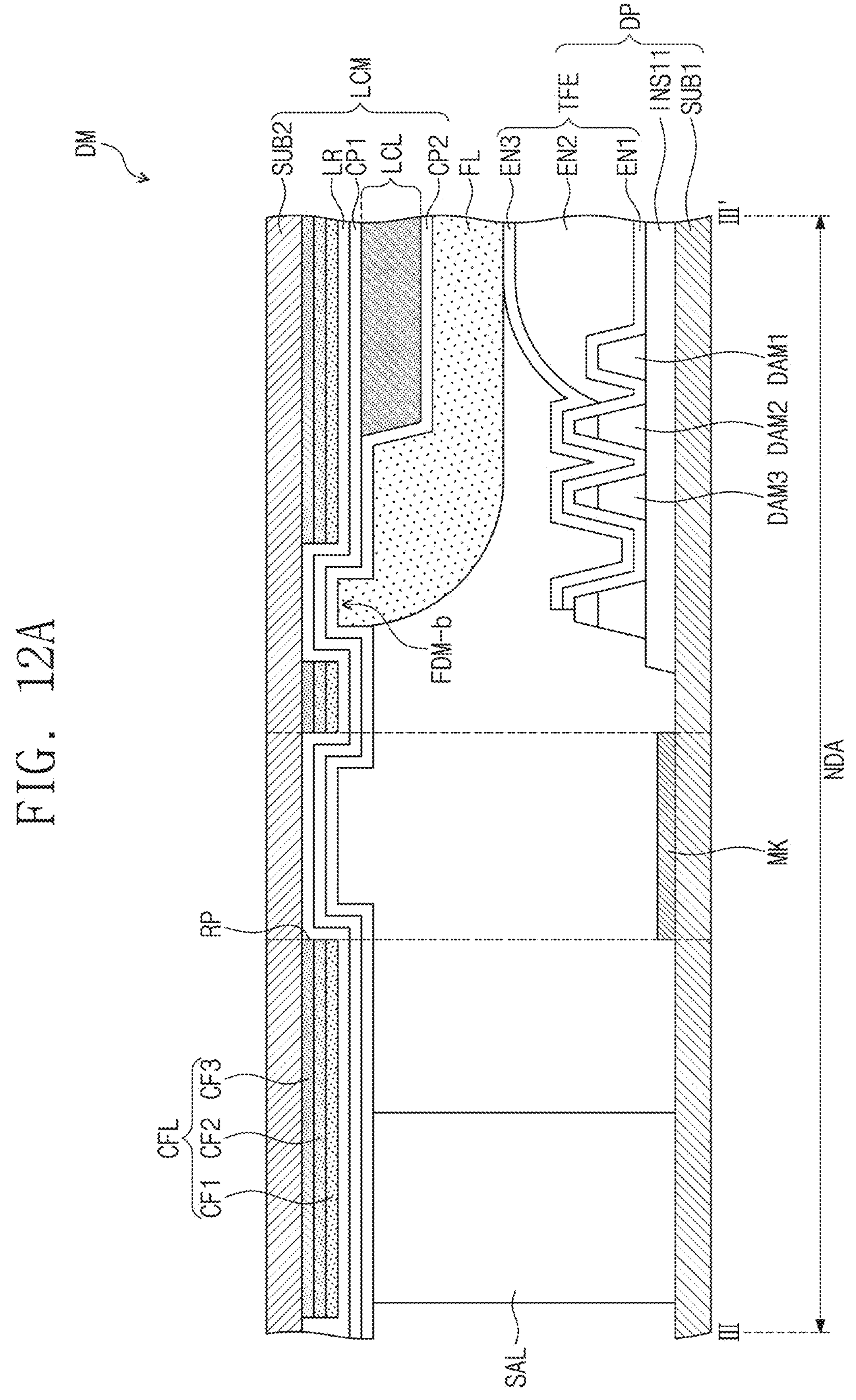
FIG. 12A is a cross-sectional view of a display module according to an embodiment of the inventive concept corresponding to line III-III' illustrated in FIG. 7B.
Figure 12B:
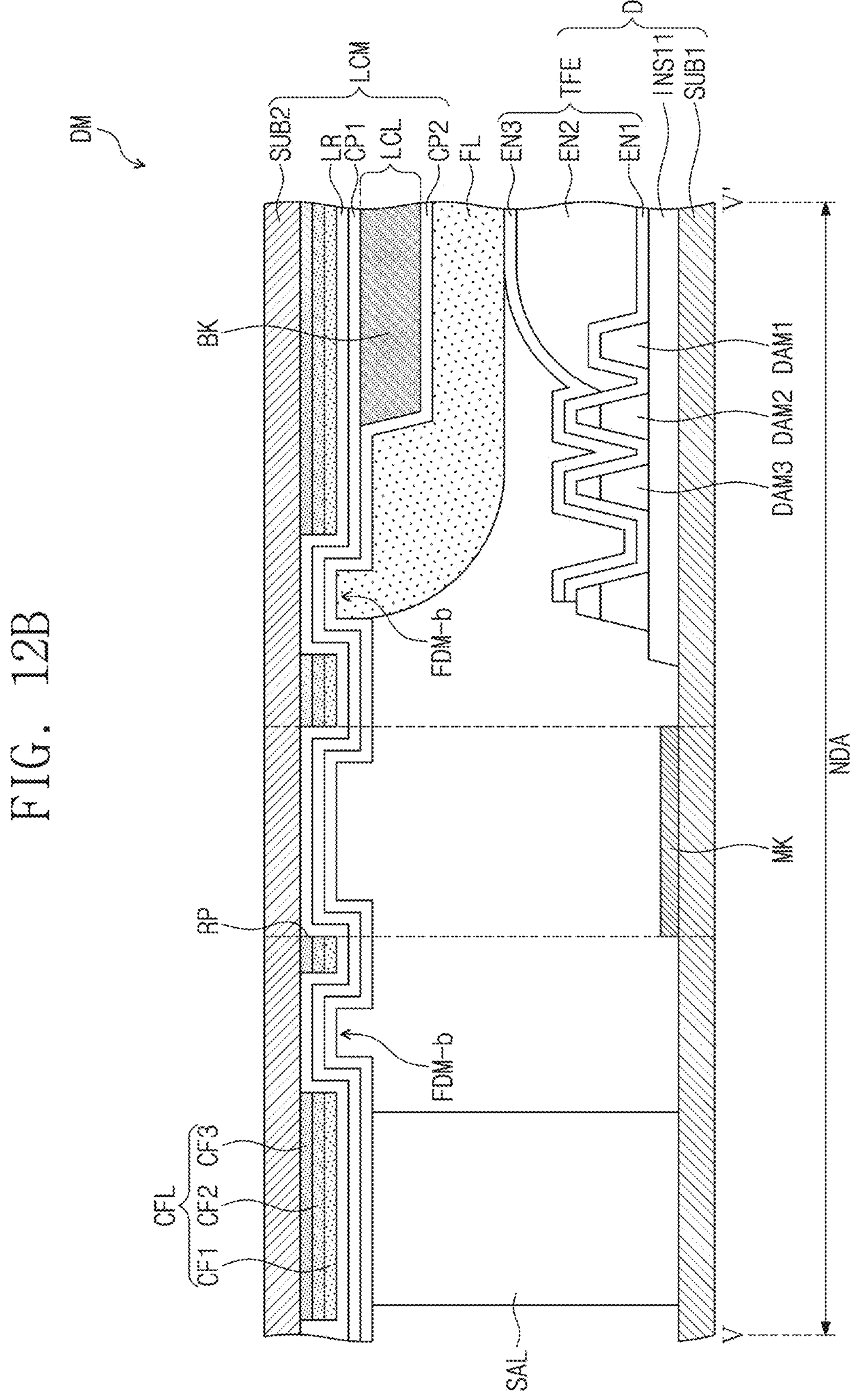
FIG. 12B is a cross-sectional view of a display module according to an embodiment of the inventive concept corresponding to line V-V' illustrated in FIG. 10B.

FIG. 12A and FIG. 12B are cross-sectional views of a display module DM according to an embodiment of the inventive concept. FIG. 12A is a cross-sectional view of a display module DM corresponding to line III-III' of FIG. 7B, and FIG. 12B is a cross-sectional view of a display module DM corresponding to line V-V of FIG. 10B. FIG. 12A and FIG. 12B include substantially the same components of the above-described embodiments, but there are some differences in the configuration of the filling member blocking portion FDM. Hereinafter, the description will focus on the differences.

Referring to FIG. 12A and FIG. 12B, the filling member blocking portion FDM of an embodiment may be a recessed portion on the lower surface of the color filter layer CFL. Specifically, the filling member blocking portion FDM of an embodiment may include a hole FDM-b penetrating the color filter layer CFL. The hole FDM-b formed by removing part of the color filter layer CFL may extend to the second substrate SUB2. In plan view, the hole FDM-b may be spaced apart from the penetration portion RP with a portion of the color filter layer CFL interposed therebetween. The hole FDM-b may prevent the filling member FL from entering the penetration portion RP.

The hole FDM-b may be formed in a portion of the color filter layer CFL disposed in the peripheral region NDA. For example, the color filter layer CFL may include the first to third color filters CF1, CF2, and CF3 stacked along a thickness direction (e.g., the third direction DR3) in the peripheral region NDA, and the hole FDM-b may be formed by a partial removal of the first to the third color filters CF1, CF2, and CF3.

In a cross-sectional view, the width of the hole FDM-b may substantially be uniform. However, in a cross-sectional view, the width of the hole FDM-b may become larger or smaller as a function of distance from the second substrate SUB2, and is not limited to any one embodiment. The width of the hole FDM-b may be defined by inner side walls formed by removing a part of the first to third color filters CF1. CF2, and CF3, and the width of the hole FDM-b may vary depending on how much material is removed for each of the first to the third color filters CF1. CF2, and CF3. This will be described in more detail with reference to FIG. 13.

The hole FDM-b may be simultaneously formed with the penetration portion RP. Therefore, the hole FDM-b may be formed without the need for an additional, separate process. However, a step of forming the hole FDM-b is not necessarily limited thereto.

A portion of the filling member FL flowing toward the hole FDM-b may enter the hole FDM-b. The filling member FL whose spread is stopped by the hole FDM-b may be cured before more filling member FL is added to flow out of the hole FDM-b to get closer to a region in where the penetration portion RP is formed. Accordingly, the penetration portion RP may be spaced apart from the filling member FL in plan view.

The hole FDM-b may overlap at least one insulation layer of the light control member LCM. For example, as illustrated in FIG. 12A, the low refractive layer LR, the first capping layer CP1, and the second capping layer CP2 may overlap the hole FDM-b. A portion of the low refractive layer LR, the first capping layer CP1, and the second capping layer CP2 overlapping the hole FDM-b may be recessed toward the second substrate SUB2. However, the configuration of an insulation layer overlapping the hole FDM-b is not limited thereto. In addition, according to an embodiment, the hole FDM-b may be formed penetrating the color filter layer CFL and the insulation layers of the light control member LCM.

The hole FDM-b may be formed between an end of the light conversion layer LCL and the penetration portion RP. For example, the hole FDM-b may be formed in a region between the outermost portion of the bank portion BK included in the light conversion layer LCL and the penetration portion RP. The hole FDM-b may be spaced apart from the light conversion laver LCL. However, the embodiment is not limited thereto.

The hole FDM-b may surround the penetration portion RP in plan view as illustrated in FIG. 10B or FIG. 10C. Therefore, as illustrated in FIG. 12B, in a cross-sectional view, one portion of the hole FDM-b may be disposed between the filling member FL and the penetration portion RP, and the other portion of the hole FDM-b may be formed between the sealing member SAL and the penetration portion RP. As the hole FDM-b completely surrounds the penetration portion RP, it is possible to effectively block the filling member FL from entering the penetration portion RP, and at the same time, it is possible to prevent the filling member FL from overflowing toward the sealing member SAL.

Figure 13:
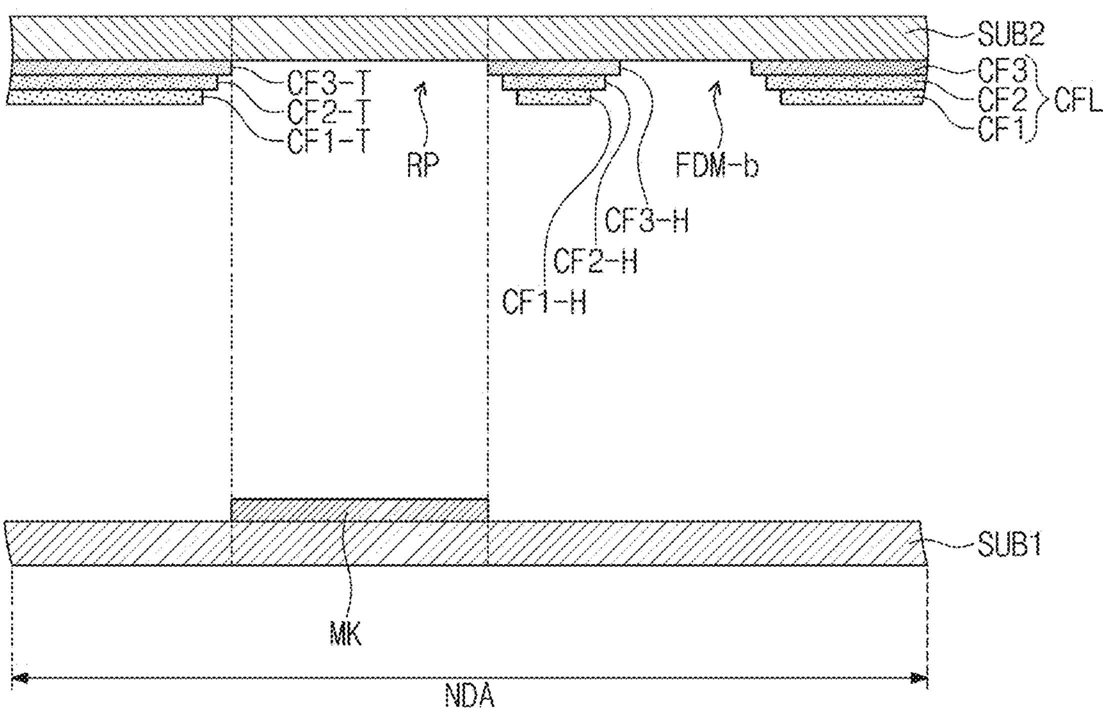
FIG. 13 is a cross-sectional view of a penetration portion according to an embodiment of the inventive concept.

FIG. 13 is a cross-sectional view of a penetration portion RP and a filling member blocking portion FDM according to an embodiment of the inventive concept. FIG. 13 exemplarily illustrates the filling member blocking portion FDM provided in the form of the hole FDM-b.

Referring to FIG. 13, the width of the penetration portion RP in a cross-sectional view may be different along a thickness direction. In the first to third color filters CF1, CF2, and CF3, penetration portions CF1-T, CF2-T, and CF3-T may be respectively defined. The penetration portions CF1-T. CF2-T, and CF3-T respectively defined in the first to third color filters CF1. CF2, and CF3 may overlap each other to form the penetration portion RP of one body.

The width of the penetration portion CF3-T defined in the third color filter CF3 (closest to the second substrate SUB2) may be smaller than the width of the penetration portion CF2-T defined in the second color filter CF2, and the width of the penetration portion CF2-T defined in the second color filter CF2 may be smaller than the width of the penetration portion CF1-T defined in the first color filter CF1 (which is farthest from the second substrate SUB2 in the embodiment of FIG. 13). Accordingly, an inner side surface of the penetration portion RP may have a stepped sidewall.

In a process of manufacturing the penetration portion RP according to an embodiment, a formation position of the penetration portion RP may be defined in the third color filter CF3 disposed most adjacent to the rear surface of the second substrate SUB2, and using a mask, the penetration portion CF3-T of the third color filter CF3 may be formed in a portion corresponding to the formation position of the penetration portion RP.

Thereafter, the second color filter CF2 may be disposed on the third color filter CF3. In order not to allow the second color filter CF2 to overlap the penetration portion CF3-T of the third color filter CF3, the penetration portion CF2-T having a width greater than the width of the penetration portion CF3-T of the third color filter CF3 may be formed in the second color filter CF2.

Thereafter, the first color filter CF1 may be disposed on the second color filter CF2. In order not to allow the first color filter CF1 to overlap the penetration portions CF2-T and CF3-T of the second and third color filters CF2 and CF3, the penetration portion CF1-T having a width greater than the width of the penetration portion CF2-T of the second color filter CF2 may be formed in the first color filter CF1.

In a process of forming the penetration portion RP, it is possible to improve the reliability of the penetration portion RP by controlling the widths of penetration portions formed in color filters.

Referring to FIG. 13, the width of the hole portion FDM-b in a cross-sectional view may be different along the thickness direction. In the first to third color filters CF1, CF2, and CF3, penetration holes CF1-H. CF2-H, and CF3-H overlapping each other may be respectively defined. The penetration holes CF1-H, CF2-H, and CF3-H overlapping each other may form the hole FDM-b.

Among the first to third color filters CF1, CF2, and CF3, in the thickness direction, the width of the penetration hole CF3-H of the third color filter CF3 disposed most adjacent to the second substrate SUB may be the smallest, and the penetration hole CF1-H of the first color filter CF1 disposed spaced farthest apart from the second substrate SUB2 may be the largest. Specifically, in a cross-sectional view, the width of the penetration hole CF3-H defined in the third color filter CF3 may be smaller than the width of the penetration hole CF2-H defined in the second color filter CF2, and the width of the penetration hole CF2-H defined in the second color filter CF2 may be smaller than the width of the penetration hole CF1-H defined in the first color filter CF1. Accordingly, an inner side surface of the hole FDM-b may have a steps, and the width of the hole FDM-b may become smaller as getting closer to the second substrate SUB2.

In a process, among the penetration holes CF1-H, CF2-H, and CF3-H, which are discontinuous sections in the color filter layer CFL, the penetration hole CF1-H of the first color first color filter CF1 disposed spaced farthest apart from the second substrate SUB2 may be formed last. In order to allow the penetration hole CF1-H of the first color filter CF1 to completely align with the penetration hole CF3-H of the third color filter CF3, the width of the penetration hole CF1-H of the first color filter CF1 may be designed to be the largest to allow for process errors. Through the above, the hole FDM-b with improved reliability may be formed at a required position. In addition, the penetration hole CF1-H formed in the first color filter CF1 that is the farthest from the second substrate SUB2 being the largest is conducive to the filling member FL (see FIG. 12A) flowing into the hole FDM-b, causing the hole FDM-b to effectively stop the filling member FL from spreading to the penetration portion RP (see FIG. 12A).

The penetration holes CF1-H, CF2-H, and CF3-H respectively formed in the first to third color filters CF1, CF2, and CF3 may be simultaneously formed with the penetration portions CF1-T, CF2-T, and CF3-T that are respectively formed in the first to third color filters CF1. CF2, and CF3. For example, after the third color filter CF3 is stacked on the rear surface of the second substrate SUB2, the third color filter CF3 may be patterned to form the penetration portion CF3-T by removing some of the third color filter CF3 and the penetration hole CF3-H spaced apart from the penetration portion CF3-T by removing another section of the third color filter CF3.

Although not shown in FIG. 13, at least one layer of the low refractive layer LR, the first capping layer CP1, or the second capping layer CP2 (shown in FIG. 12B) may be disposed in the penetration portion RP and the hole FDM-b. In an embodiment, the low refractive layer LR, the first capping layer CP1, and the second capping layer CP2 may cover inner surfaces of the penetration portions CF1-T, CF2-T, and CF3-T respectively defined in the first to third color filters CF1, CF2, and CF3, and the rear surface of the second substrate SUB2 that forms the base of the penetration portion RP. In addition, the low refractive layer LR, the first capping layer CP1, and the second capping layer CP2 may cover inner surfaces of the penetration holes CF1-H, CF2-H, and CF3-H respectively defined in the first to third color filters CF1, CF2, and CF3, and the back surface of the second substrate SUB2 exposed by the hole FDM-b.

A display device according to an embodiment may include an alignment pattern included in a display panel, and a penetration portion defined in a light control member and overlapping the alignment pattern, and the alignment pattern and the penetration portion may serve as an align-key indicating the position of the display panel during a manufacturing process of a display device. However, in a process of bonding the display panel and the light control member, a filling member disposed between the display panel and the light control member may enter into the penetration portion, and the filling member may generate a bubble inside the penetration portion, so interfering with the alignment pattern being recognized as the align-key. The display device according to an embodiment may include a filling member blocking portion which prevents the filling member from entering the penetration portion. By preventing the filling member from entering the penetration portion, it is possible to prevent process failure in which the alignment pattern is not recognized as the align-key, and accordingly, the reliability of the manufacturing process of a display device and the reliability of the display device may be improved.

An alignment pattern formed on a first substrate and a penetration portion formed on a second substrate of an embodiment of the inventive concept may improve the alignment accuracy between the first substrate and the second substrate, which may be used as an align-key in the following process to improve the process reliability of a display device.

Although the present invention has been described with reference to preferred embodiments of the present invention, it will be understood by those skilled in the art that various modifications and changes in form and details may be made therein without departing from the spirit and scope of the present invention as set forth in the following claims.

Accordingly, the technical scope of the present invention is not intended to be limited to the contents set forth in the detailed description of the specification, but is intended to be defined by the appended claims.

What is claimed is:

1. An electronic device comprising a display device, wherein the display device comprises:

a first substrate including an upper surface and a lower surface;

a second substrate including a rear surface facing the upper surface;

a sealing member disposed between the first substrate and the second substrate to couple the first substrate and the second substrate;

a plurality of light emitting elements disposed on the upper surface;

a circuit layer disposed between the first substrate and the light emitting elements, and including a plurality of driving elements respectively connected to the plurality of light emitting elements;

an alignment pattern disposed on the upper surface and spaced apart from the plurality of light emitting elements;

a color filter layer including a plurality of color filters disposed on the rear surface, and having a penetration portion overlapping the alignment pattern in plan view;

a filling member disposed between the color filter layer and the light emitting elements; and a filling member blocking portion disposed between the filling member and the penetration portion in plan view, wherein the filling member is spaced apart from the penetration portion, wherein the penetration portion and the alignment pattern are disposed between the sealing member and the filling member in plan view.

2. The electronic device of claim 1, wherein the filling member blocking portion surrounds at least a portion of the outer perimeter of the penetration portion.

3. The electronic device of claim 2, wherein the filling member blocking portion surrounds the penetration portion in plan view.

4. The electronic device of claim 1, wherein a portion of the filling member blocking portion is covered by the filling member.

5. The electronic device of claim 1, wherein the filling member blocking portion comprises a hole penetrating the color filter layer, and a portion of the color filter layer is between the hole of the filling member blocking portion and the penetration portion.

6. The electronic device of claim 5, wherein the width of the hole of the filling member blocking portion is uniform.

7. The electronic device of claim 5, wherein the width of the hole of the filling member blocking portion changes as a function of distance from the rear surface of the second substrate.

8. The electronic display device of claim 1, wherein the filling member blocking portion comprises a blocking dam, and the blocking dam is disposed on a lower surface of the color filter layer and protrudes toward the first substrate.

9. The electronic display device of claim 8, further comprising a light conversion layer disposed between the color filter layer and the filling member, wherein the light conversion layer includes:

a bank portion including a plurality of openings respectively overlapping the plurality of light emitting elements; and a plurality of light conversion portions respectively disposed in the plurality of openings.

10. The electronic device of claim 9, wherein the blocking dam comprises the same material as the material of the bank portion.

11. The electronic device of claim 8, further comprising a column spacer disposed between the color filter layer and the plurality of light emitting elements, and covered by the filling member, wherein the blocking dam includes the same material as the material of the column spacer.

12. The electronic device of claim 8, wherein the blocking dam is provided in plurality, and the plurality of the blocking dams have the same size.

13. The electronic device of claim 8, wherein the blocking dam is provided in plurality, and the plurality of the blocking dams have different sizes.

14. The electronic device of claim 1, wherein the color filter layer comprises the plurality of color filters are stacked in a thickness direction, and the penetration portion is defined by absence of the plurality of color filters.

15. The electronic device of claim 1, wherein the width of the penetration portion is uniform.

16. The electronic device of claim 1, wherein the width of the penetration portion adjacent to the rear surface of the second substrate is smaller than the width of the penetration portion adjacent to a lower surface of the color filter layer.

17. The electronic device of claim 1, wherein the shape of the penetration portion is the same as the shape of the alignment pattern.

18. The electronic device of claim 1, further comprising an insulation layer disposed between the color filter layer and the filling member, wherein the insulation layer covers the penetration portion.

19. The electronic device of claim 1, further comprising:

an encapsulation layer disposed between the filling member and the plurality of light emitting elements; and a dam disposed outside of the encapsulation layer and contacting the encapsulation layer, wherein the filling member blocking portion is spaced apart from the encapsulation layer.

20. The electronic device of claim 1, wherein the alignment pattern comprises a metal.

21. An electronic comprising a display device, wherein the display device comprises:

a lower substrate including an upper surface;

an upper substrate including a rear surface facing the upper surface;

a sealing member disposed between the lower substrate and the upper substrate to couple the lower substrate and the upper substrate;

a plurality of light emitting elements disposed on the upper surface;

a circuit layer disposed between the lower substrate and the plurality of light emitting elements, and including a plurality of driving elements respectively connected to the plurality of light emitting elements;

an alignment pattern disposed on the upper surface and spaced apart from the plurality of light emitting elements;

an encapsulation layer configured to encapsulate the plurality of light emitting elements;

a color filter layer disposed on the rear surface and having a penetration portion that is aligned with the alignment pattern;

a filling member disposed between the color filter layer and the encapsulation layer; and a filling member blocking portion disposed between the penetration portion and the filling member in plan view and protruding or recessed from a lower surface of the color filter layer, wherein the penetration portion and the alignment pattern are disposed between the sealing member and the filling member in plan view.

22. The electronic device of claim 21, wherein the filling member blocking portion surrounds at least a portion of the outer perimeter of the penetration portion.

* * * * *